(12) United States Patent
Thrasher et al.

(10) Patent No.: US 11,856,690 B2
(45) Date of Patent: *Dec. 26, 2023

(54) SUBSTRATES COMPRISING A NETWORK COMPRISING CORE SHELL LIQUID METAL ENCAPSULATES COMPRISING MULTI-FUNCTIONAL LIGANDS

(71) Applicant: Government of the United States, as represented by the Secretary of the Air Force, Wright-Patterson AFB, OH (US)

(72) Inventors: Carl J. Thrasher, Huber Heights, OH (US); Christopher E. Tabor, Kettering, OH (US); Zachary J. Farrell, Xenia, OH (US); Nicholas J. Morris, Dayton, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 239 days.

This patent is subject to a terminal disclaimer.

(21) Appl. No.: 17/386,807

(22) Filed: Jul. 28, 2021

(65) Prior Publication Data

US 2021/0360782 A1 Nov. 18, 2021

Related U.S. Application Data

(63) Continuation of application No. 16/671,708, filed on Nov. 1, 2019, now Pat. No. 11,102,883.

(Continued)

(51) Int. Cl.
*H05K 1/02* (2006.01)
*H05K 1/09* (2006.01)

(Continued)

(52) U.S. Cl.
CPC .............. *H05K 1/0283* (2013.01); *H05K 1/09* (2013.01); *H05K 3/10* (2013.01); *H05K 3/22* (2013.01);

(Continued)

(58) Field of Classification Search
CPC ...... G06F 21/554; H05K 1/0283; H05K 1/09; H05K 3/10; H05K 3/22; H05K 2201/0245;

(Continued)

(56) References Cited

U.S. PATENT DOCUMENTS

| 4,203,317 A | 5/1980 | Gupta |
| 5,198,189 A | 3/1993 | Booth et al. |

(Continued)

FOREIGN PATENT DOCUMENTS

| JP | H11220182 A | 8/1999 |
| KR | 101687371 B1 | 12/2016 |

(Continued)

OTHER PUBLICATIONS

Ren, L.; Sun, S.; Casillas-Garcia, G.; Nancarrow, M.; Peleckis, G.; Turdy, M.; Du, K.; Xu, X.; Li, W.; Jiang, L.; Dou, S. X.; Du, Y.; A Liquid-Metal-Based Magnetoactive Slurry for Stimuli-Responsive Mechanically Adaptive Electrodes. Advanced Materials. Adv. Mater. 2018, 30, 1802595.

(Continued)

*Primary Examiner* — Khanh T Nguyen
(74) *Attorney, Agent, or Firm* — AFMCLO/JAZ; James F. McBride

(57) ABSTRACT

The present invention relates to substrates comprising a network comprising core shell liquid metal encapsulates comprising multi-functional ligands and processes of making and using such substrates. The core shell liquid metal particles are linked via ligands to form such network. Such (Continued)

networks volumetric conductivity increases under strain which maintains a substrate's resistance under strain. The constant resistance results in consistent thermal heating via resistive heating. Thus allowing a substrate that comprises such network to serve as an effective heat provider.

6 Claims, 1 Drawing Sheet

Related U.S. Application Data

(60) Provisional application No. 62/754,635, filed on Nov. 2, 2018, provisional application No. 62/754,631, filed on Nov. 2, 2018, provisional application No. 62/754,624, filed on Nov. 2, 2018.

(51) Int. Cl.
  *H05K 3/22* (2006.01)
  *H05K 3/10* (2006.01)

(52) U.S. Cl.
  CPC .............. *H05K 2201/0245* (2013.01); *H05K 2201/0314* (2013.01); *H05K 2203/0783* (2013.01); *H05K 2203/1105* (2013.01); *H05K 2203/1131* (2013.01)

(58) Field of Classification Search
  CPC ... H05K 2201/0314; H05K 2203/0783; H05K 2203/1105; H05K 2203/1131
  See application file for complete search history.

(56) References Cited

U.S. PATENT DOCUMENTS

| | | |
|---|---|---|
| 5,547,531 A | 8/1996 | Allen et al. |
| 6,022,429 A | 2/2000 | Hagstrom |
| 6,174,476 B1 | 1/2001 | Kennedy et al. |
| 7,491,892 B2 | 2/2009 | Wagner et al. |
| 8,323,435 B2 | 12/2012 | Durrance et al. |
| 9,859,226 B1 | 1/2018 | Campbell et al. |
| 9,930,773 B2 | 3/2018 | Holbery et al. |
| 2003/0215394 A1 | 11/2003 | Short et al. |
| 2005/0284232 A1 | 12/2005 | Rice |
| 2008/0277631 A1 | 11/2008 | Smela et al. |
| 2013/0244037 A1 | 9/2013 | Hohman et al. |
| 2014/0147959 A1 | 5/2014 | Ratcurt et al. |
| 2016/0049227 A1 | 2/2016 | Bottiglio et al. |
| 2016/0218287 A1 | 7/2016 | McAlpine et al. |
| 2016/0317992 A1 | 11/2016 | Thuo et al. |
| 2017/0089774 A1 | 3/2017 | Rykaczewski et al. |
| 2017/0218167 A1 | 8/2017 | Majidi et al. |
| 2017/0235021 A1 | 8/2017 | Boley et al. |
| 2018/0029290 A1 | 2/2018 | Bottiglio et al. |
| 2018/0354037 A1 | 12/2018 | Thuo et al. |

FOREIGN PATENT DOCUMENTS

| | | |
|---|---|---|
| WO | WO2013044226 A2 | 3/2013 |
| WO | WO2015073944 A2 | 5/2015 |
| WO | WO2017072347 A1 | 5/2017 |
| WO | WO2017151523 A1 | 9/2017 |

OTHER PUBLICATIONS

Park, S.; Thangavel, G.; Parida, K.; Li, S.; Lee, P. S.; A Stretchable and Self-Healing Energy Storage Device Based on Mechanically and Electrically Restorative Liquid-Metal Particles and Carboxylated Polyurethane Composites. Adv. Mater. 2019, 31, 1805536.

Morris, N. J.; Farrell, Z. E.; Tabor, C. E.; Chemically modifying the mechanical properties of core-shell liquid metal nanoparticles. Nanoscale, 2019, 11, 17308-17318.

Liang, S.; Li, Y.; Chen, Y.; Yang, J.; Zhu, T.; Zhu, D.; He, C.; Liu, Y.; Handschuh-Wang, S.; Zhou, X.; Liquid metal sponges for mechanically durable, all-soft, electrical conductors. J. Mater. Chem. C, 2017, 5, 1586-1590.

Song, H.; Kim, T.; Kang, S.; Jin, H.; Lee, K.; Yoon, H. J.; Ga-Based Liquid Metal Micro/Nanoparticles: Recent Advances and Applications. Small 2019, 1903391.

Saborio, M. G.; Cai, S.; Tang, J.; Ghasemian, M. B.; Mayyas, M.; Han, J.; Michael J. Christoe, M. J.; Peng, S.; Koshy, P.; Esrafilzadeh, D.; Jalili, R.; Wang, C. H.; Kalantar-Zadeh, K.; Liquid Metal Droplet and Graphene Co-Fillers for Electrically Conductive Flexible Composites. Small 2019, 1903753.

Tutika, R.; Kmiec, S.; Haqu, A. B. M. T.; Martin, S. W.; Bartlett, M. D.; Liquid Metal-Elastomer Soft Composites with Independently Controllable and Highly Tunable Droplet Size and Volume Loading. ACS Appl. Mater. Interfaces 2019, 11, 17873-17883.

Li, X.; Li, M.; Xu, J.; You, J.; Yang, Z.; Li, C.; Evaporation-induced sintering of liquid metal droplets with biological nanofibrils for flexible conductivity and responsive actuation. Nature Communications, 2019, 10:3514.

Guo, R.; Wang, H.; Sun, X.; Yao, S.; Chang, H.; Wang, H.; Liu, J.; Zhang, Y.; Semiliquid Metal Enabled Highly Conductive Wearable Electronics for Smart Fabrics. ACS Appl. Mater. Interfaces 2019, 11, 30019-30027.

Park, J. E.; Kang, H. S.; Baek, J.; Park, T.H.; Oh, S.; Lee, H.; Koo, M.; Park, C.; Rewritable, Printable Conducting Liquid Metal Hydrogel. ACS Nano 2019, 13, 9122-9130.

Giesche, H.; Part. Part. Syst. Charact. 2006, 23, 9-19.

Feb. 19, 2021, Office Action For U.S. Appl. No. 16/671,708.

Machine Translation of JPH11220182A, Yasunori et al. Publication Date Aug. 10, 1999.

Machine Translation of KR101687371 B1, Kyoo et al. Publication Date Dec. 16, 2016.

Bartlett, Michael D.; Fassler, Andrew; Kazem, Navid; Markvicka, Eric J.; Mandal, Pratiti; Majidi, Carmel; Stretchable, High-k Dielectric Elastomers through Liquid-Metal Inclusions. Adv. Mater. 2016, 28, 3726-3731.

Wagner, Sigurd; Bauer, Siegfried; Materials for stretchable electronics. MRS Bulletin, 2012, 37, 207-213.

Xu, Feng; Zhu, Yong; Highly conductive and stretchable silver nanowire conductors. Adv. Mater. 2012, 24, 5117-5122.

Liu, Z. F.; Fang, S.; Moura, F. A.; Ding, J. N.; Jiang, N.; Di, J.; Zhang, M.; Lepro, X.; Galvao, D. S.; Haines, C. S.; Yuan, N. Y.; Yin, S. G.; Lee, D. W.; Wang, R.; Wang, H. Y.; Lv, W.; Dong, C.; Zhang, R. C.; Chen, M. J.; Yin, Q.; Chong, Y. T.; Zhang, R.; Wang, X.; Lima, M. D.; Ovalle-Robles, R.; Qian, D.; Lu, H.; Baughman, R. H.; Hierarchically buckled sheath-core fibers for superelastic electronics, sensors, and muscles. Science 2015, 349, 6246, 400-404.

Wang, Jiangxin; Cai, Guofa; Li, Shaohui; Gao, Dace; Xiong, Jiaqing; Lee, Pooi See; Printable Superelastic Conductors with Extreme Stretchability and Robust Cycling Endurance Enabled by Liquid-Metal Particles. Adv. Mater. 2018, 30, 1706157, 1-7.

Hirsch, Arthur; Michaud, Hadrien O.; Gerratt, Aaron P.; De Mulatier, Severine; Lacour, Stephanie P.; Intrinsically Stretchable Biphasic (Solid-Liquid) Thin Metal Films. Adv. Mater. 2016, 28, 4507-4512.

Trevor R. Lear, Seok-Hee Hyun, John William Boley, Edward L. White, David H. Thompson, Rebecca K. Kramera, Liquid metal particle popping: Macroscale to nanoscale. Extreme Mechanics Letters 2017, 13, 126-134.

Boley, John W.; White, Edward L.; Kramer, Rebecca K.; Mechanically Sintered Gallium-Indium Nanoparticles. Adv. Mater. 2015, 27, 2355-2360.

Yamaguchi, Akihisa; Mashima, Yu; Iyoda, Tomokazu; Reversible Size Control of Liquid-Metal Nanoparticles under Ultrasonication. Angew. Chem. Int. Ed. 2015, 54, 12809-12813.

Cooper, Matthew A.; Ostanin, Victor P.; Klenerman, David; Slepstov, Alexander; Karaimanska, Rossitza; Dultsev, Fedor N.; Stirrups, Kathleen; Kelling, Sven; Iminson, Tony; Abell, Chris; A sensitive and economical method to directly detect particles. Sensors, 2002 IEEE; DOI: 10.1109/ICSENS.2002.1037256,1042-1045.

(56) References Cited

OTHER PUBLICATIONS

Tang, Shi-Yang; Qiao, Ruirui; Yan, Sheng; Yuan, Dan; Zhao, Qianbin; Yun, Guolin; Davis, Thomas P.; Li, Weihua; Microfluidic Mass Production of Stabilized and Stealthy Liquid Metal Nanoparticles. Small 2018, 14, 1800118, 1-8.

Tevis, Ian D.; Newcomb, Lucas B.; Thuo, Martin; Synthesis of Liquid Core-Shell Particles and Solid Patchy Multicomponent Particles by Shearing Liquids Into Complex Particles (SLICE). Langmuir 2014, 30, 14308-14313.

Pan, Chengfeng; Kumar, Kitty; Li, Jianzhao; Markvicka, Eric J.; Herman, Peter R.; Majidi, Carmel; Visually Imperceptible Liquid-Metal Circuits for Transparent, Stretchable Electronics with Direct Laser Writing; Adv. Mater. 2018, 1706937, 1-9.

Çinar, Simge; Tevis, Ian D.; Chen, Jiahao; Thuo, Martin; Mechanical Fracturing of Core-Shell Undercooled Metal Particles for Heat-Free Soldering; Scientific Reports 2016,| 6:21864 | DOI: 10.1038/srep21864, 1-10.

Kubo, Masahiro; Li, Xiaofeng; Kim, Choongik; Hashimoto, Michinao; Wiley, Benjamin J.; Ham, Donhee; Whitesides; George M.; Stretchable Microfluidic Radiofrequency Antennas; Adv. Mater. 2010, 22, 2749-2752.

Hayes, Gerard J.; So, Ju-Hee; Qusba, Amit; Dickey, Michael D.; Lazzi, Gianluca; Flexible Liquid Metal Alloy (EGaIn) Microstrip Patch Antenna. IEEE Transactions on Antennas and Propagation. 2012, vol. 60, No. 5, 2151-2156.

So, Ju-Hee; Thelen, Jacob; Qusba, Amit; Hayes, Gerard J.; Lazzi, Gianluca; Dickey, Michael D.; Reversibly Deformable and Mechanically Tunable Fluidic Antennas. Adv. Funct. Mater. 2009, 19, 3632-3637.

Larmagnac, Alexandre; Eggenberger, Samuel; Janossy, Hanna; Voros, Janos; Stretchable electronics based on Ag-PDMS composites. Scientific Reports, 2014, 4:7254, 1-7.

Fassler, Andrew; Majidi, Carmel; Liquid-Phase Metal Inclusions for a Conductive Polymer Composite. Adv. Mater. 2015, 27, 1928-1932.

Khan, M. Rashed; Hayes, Gerard J.; Zhang, Silu; Dickey, Michael D.; Lazzi, Gianluca; A pressure responsive fluidic microstrip open stub resonator using a liquid metal alloy. IEEE Microwave Wireless Components Letters, 2012, vol. 22, No. 11, pp. 577-579.

Kubo, Masahiro; Li, Xiaofeng; Kim, Choongik; Hashimoto, Michinao; Wiley, Benjamin J.; Ham, Donhee; Whitesides, George M.; Stretchable microfluidic electric circuit applied for radio frequency antenna. Proc. IEEE APS-URSI, 2011, pp. 1582-1587.

Mazlouman, Shahrzad J.; Jiang, Xing J.; Mahanfar, Alireza N.; Menon, Carlo; Vaughan, Rodney G.; A reconfigurable patch antenna using liquid metal embedded in a silicone substrate. IEEE Trans. Antenna Propagat. Lett., 2011, vol. 59, pp. 4406-4412.

Diedhiou, Daouda L.; De Sagazan, Olivier; Sauleau, Ronan; Boriskin, Artem V.; Contactless microstrip transition for flexible microfluidic circuits and antennas. IEEE Antennas Wireless Propagat. Lett., 2015, vol. 14, pp. 1502-1505.

Agar, J.; Durden, J.; Staiculescu, D.; Zhang, R.; Gebara, E. ; Wong, C.P.; Electrically conductive silicone nano-composites for stretchable RF devices. IEEE MTT-S IMS 2011.

Thrasher, C.; Zachary Farrell, Z.; Morris, N.; Willey, C.; Tabor, C.; Supporting Materials, Adv. Mater., 2019 DOI: 10.1002/adma.201903864, 1-7.

Thrasher, C.; Zachary Farrell, Z.; Morris, N.; Willey, C.; Tabor, C.; Mechanoresponsive Polymerized Liquid Metal Networks, Adv. Mater. 2019, 1903864, 1-8.

Tabor, C.; Polymerized Liquid Metal Networks for Stretchable Electronics ACS Colloids and Interfaces Conference, Jun. 18, 2019.

Tabor, C.; Adaptive 3D-Printed Liquid Metal Electronics TMS 2019, Mar. 13, 2019.

Tabor, C.; Responsive 3D-Printed Liquid Metal Electronics, MITRE Workshop May 6, 2019.

Tabor, C.; Gordon Research Conference Poster, Jan. 30, 2019.

Tabor, C.; Responsive Liquid Metals for Reconfigurable, Ultra-Stretchable, and Self-Healing Electronics, IEEE Flex Electronics Meeting, Aug. 13, 2019.

Tabor, C.; Polymerized Liquid Metal Networks for Stretchable Electronics, Flex Tech 2019, Feb. 21, 2019.

Tabor, C. Seminar Georgia Tech. Oct. 4, 2019.

Zhu, P.; Gao, S.; Lin, H.; Lu, X.; Yang, B.; Zhang, L.; Chen, Y.; Shi, J.; Inorganic Nanoshell-Stabilized Liquid Metal for Targeted Photonanomedicine in NIR-II Biowindow. Nano Lett. 2019, 19, 2128-2137.

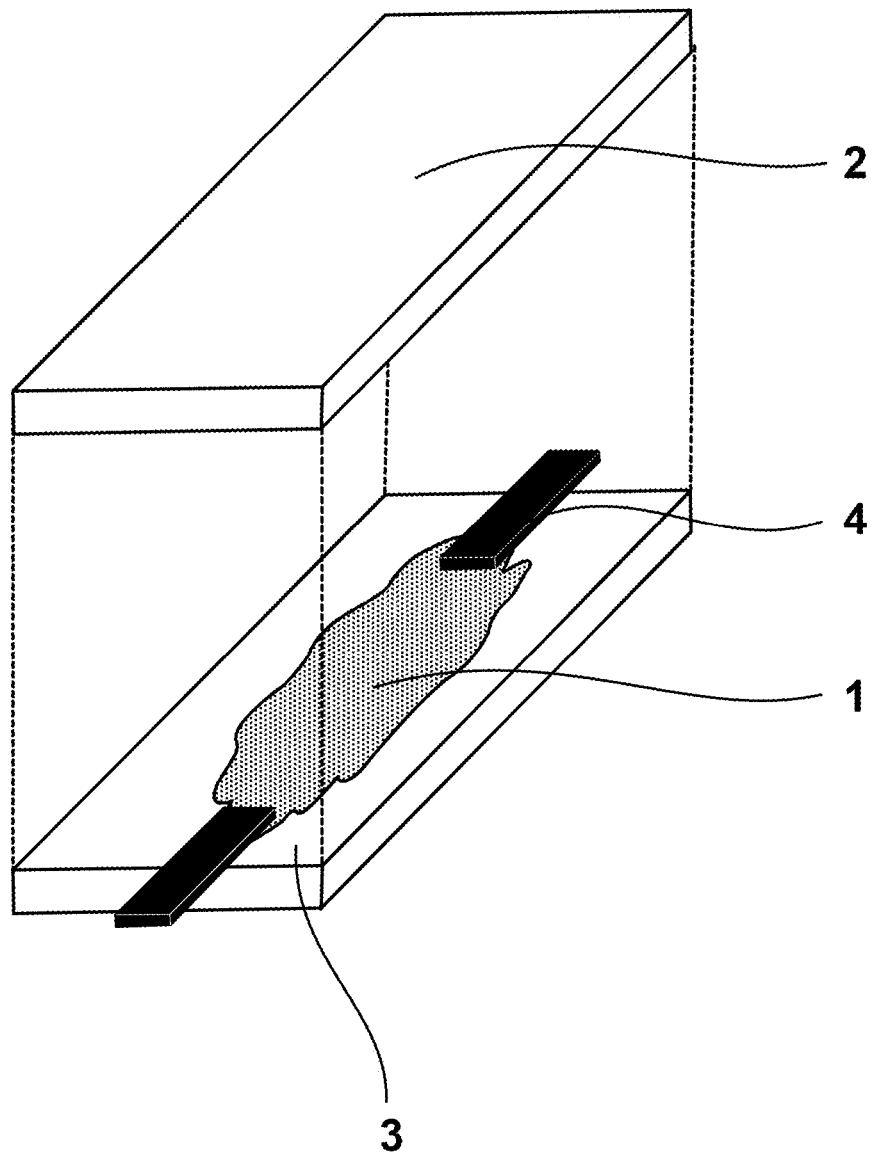

SUBSTRATES COMPRISING A NETWORK COMPRISING CORE SHELL LIQUID METAL ENCAPSULATES COMPRISING MULTI-FUNCTIONAL LIGANDS

CROSS-REFERENCE TO RELATED APPLICATION

The present application is a continuation of and claims priority to U.S. patent application Ser. No. 16/671,708 filed Nov. 1, 2019 which in turn claims priority to U.S. Provisional Application Ser. No. 62/754,624 filed Nov. 2, 2018, U.S. Provisional Application Ser. No. 62/754,631 filed Nov. 2, 2018, U.S. Provisional Application Ser. No. 62/754,635 filed Nov. 2, 2018, the contents of which are hereby incorporated by reference in their entry.

RIGHTS OF THE GOVERNMENT

The invention described herein may be manufactured and used by or for the Government of the United States for all governmental purposes without the payment of any royalty.

FIELD OF THE INVENTION

The present invention relates to substrates comprising a network comprising core shell liquid metal encapsulates comprising multi-functional ligands and processes of making and using such substrates.

BACKGROUND OF THE INVENTION

Substrates that provide resistive heating are desired in garments, medical devices and robotics. In order to provide resistive heating, substrates typically incorporate a conductor. As conductors elongate under strain, they typically start to lose their ability to conduct current. In response to this problem, substrates comprising carbon based inks have been developed. Unfortunately, carbon based inks while better than previous materials still lose their ability to conduct current. Thus, what is needed is a substrate comprising a conductor that minimizes the aforementioned problems.

Applicants recognized that the source of the aforementioned problems lie in the fact that the conductive path of carbon based inks gets longer under strain and the conductivity of the carbon component of such inks changes. Thus the volumetric conductivity of the carbon based inks decreases under strain. Applicants discovered that replacing the carbon based inks with a network comprising core shell liquid metal encapsulates comprising multi-functional ligands was the solution to the aforementioned problems. Such networks volumetric conductivity increases under strain which maintains a substrate's resistance under strain. The constant resistance results in consistent thermal heating via resistive heating. Thus, Applicants disclose substrates comprising networks comprising core shell liquid metal encapsulates and processes of making and using such substrates.

SUMMARY OF THE INVENTION

The present invention relates to substrates comprising a network comprising core shell liquid metal encapsulates comprising multi-functional ligands and processes of making and using such substrates. The core shell liquid metal particles are linked via ligands to form such network. Such networks volumetric conductivity increases under strain which maintains a substrate's resistance under strain. The constant resistance results in consistent thermal heating via resistive heating. Thus allowing a substrate that comprises such network to serve as an effective heat provider.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

FIG. 1 is an isometric view of a substrate having a bottom surface (3) onto which a core shell liquid metal encapsulate network (1) having optionally connected electrodes (4) and a top surface (2) applied on top of the core shell liquid metal encapsulate network.

DETAILED DESCRIPTION OF THE INVENTION

Definitions

Unless specifically stated otherwise, as used herein, the terms "a", "an" and "the" mean "at least one".

As used herein, the terms "include", "includes" and "including" are meant to be non-limiting.

As used in this specification the terms "encapsulate" and "particle" are synonymous As used in this specification, the term "EGaIn" is used to denote an alloy composed of 85.8% Ga, 14.2% In on an atomic basis.

All references in this specification to ImageJ software are to ImageJ software Version 1.51n.

Unless otherwise noted, all component or composition levels are in reference to the active portion of that component or composition, and are exclusive of impurities, for example, residual solvents or by-products, which may be present in commercially available sources of such components or compositions.

All percentages and ratios are calculated by weight unless otherwise indicated. All percentages and ratios are calculated based on the total composition weight unless otherwise indicated.

It should be understood that every maximum numerical limitation given throughout this specification includes every lower numerical limitation, as if such lower numerical limitations were expressly written herein. Every minimum numerical limitation given throughout this specification will include every higher numerical limitation, as if such higher numerical limitations were expressly written herein. Every numerical range given throughout this specification will include every narrower numerical range that falls within such broader numerical range, as if such narrower numerical ranges were all expressly written herein.

Substrates and Articles Comprising Same

For purposes of this specification, headings are not considered paragraphs and thus this paragraph is paragraph seventeen of the present specification. The individual number of each paragraph above and below this paragraph can be determined by reference to this paragraph's number. In this paragraph seventeen, Applicants disclose a substrate comprising a first material selected from the group the group consisting of films comprising celluloses, animal leathers, natural polyisoprenes, natural latex rubbers, modified starches, skin, polyvinyl chlorides, polyethyleneterephtalate, polypropylenes, hydroxyethylacrylate, acrylics, modacrylics, polylactic acids, polybutadienes, nylons, aramids, polyesters, polyvinyl alcohols, polyurethanes, polyureas, polystyrenes, polyhydroxybutyrates, polyglycolides, polydimethylsiloxanes, polycaprolactones, styrene-butadiene rubbers, polybutylenes, polyisoprenes, polychloroprenes, polybutenes, polyhydroxyalkanoates, poly(3-hydroxybutyrate-co-3-hydroxyvalerate), poly(vinylidene fluoride) and copolymers, tetrafluoroethylene copolymers, perfluoromethylvinyl ether copolymers, tetrafluoroethylene propylene, polyolefins, polybutylene succinates, polybutylene adipate terephthalates, and mixtures thereof; preferably, said material is selected from the group consisting of films comprising animal leathers, natural polyisoprenes, synthetic polyisoprenes, modified starches, polyvinyl chlorides, hydroxyethylacrylates, polybutadienes, polyvinyl alcohols, polyurethanes, polyureas, polydimethysiloxanes, styrene-butadiene rubbers, polybutylenes, polyisoprenes, polychloroprenes, polybutenes, polyhydroxyalkanoate copolymers, poly(3-hydroxybutyrate-co-3-hydroxyvalerate), polyolefins, polybutylene adipate terephthalates, and mixtures thereof and/or a material selected from the group consisting of fibers comprising cellulosic polymers, lignin-based polymers, proteinaceous polymers, minerals, vinyls, polyacrylonitriles, modacrylics, polystyrenes, polylactides, polybutadienes, polyesters, polyamides, polyethylenes, polybenzoxazoles, polyurethanes, polyureas, polyhydroxybutyrates, polyglycolides, polycaprolactones, polydimethylsiloxanes, polytetrafluoroethylenes, fluorinates ethylene propylenes, ethylene tetrafluoroethylenes, polyolefins, polyhydroxyalkanoates, polybutylene succinates, polybutylene adipate terephthalates, carbon fibers, and mixtures thereof; preferably said material is selected from the group consisting of fibers comprising cotton, silk, linen, animal wools, jute, grasses, rush, hemp, sisal, coir, kapok, rice, nettle, rayon, bast, glass fiber, basalt fiber, polyvinyl chloride, aramids, nylons, polyacrylonitriles, modacrylics, polystyrenes, polylactides, polybutadienes, polyesters, polyethylenes, polybenzoxazole, polyurethanes, polyureas, polyhydroxybutyrates, polyglycolides, polycaprolactones, polydimethysiloxanes, polyolefins, polyhydroxyalkanoates, polybutylene succinates, polybutylene adipate terephthalates, and mixtures thereof; most preferably said material is selected from the group consisting of fibers comprising cotton, silk, linen, sheep's wool, rayon, aramids, nylons, polyacrylonitriles, modacrylics, polyesters, polyethylenes, polyurethanes, polydimethylsiloxanes, polyolefins, and mixtures thereof, and a core shell liquid metal encapsulate network comprising a plurality of encapsulates comprising a liquid metal core having an external surface, a metal oxide shell that encapsulates said liquid metal core, said shell having an external shell surface; and optionally one or more multi-functional ligands covalently bound to said shell's external surface and/or coordinatively bound to said liquid metal core's external surface:

a) said liquid metal core comprising a liquid metal selected from the group consisting of Hg, Pb, Sn, Sb, Cd, Bi, Ga, In, Al, Zn, Ag, Au, Tl and mixtures thereof; preferably said liquid metal is selected from the group consisting of Ga, In, Sn, Bi, Pb, Cd, Sb and mixtures thereof; more preferably said liquid metal is selected from the group consisting of Ga, In, Sn, Bi, Sb and mixtures thereof; most preferably said liquid is metal selected from the group consisting of Ga, In and mixtures thereof;

b) said shell comprising a metal oxide comprising a cation derived from a metal selected from the group consisting of Ga, In, Sn, Pb, Sb, Cd, Al, Zn, Tl, Bi, Ca, Sc, Ti, V, Cr, Sr, Y, Zr, Nb, Mo, Te, Gd, Hf, Pr, Nd, Pt, Sm, Eu, Dy, Ho, Er, Yb, Pu and mixtures thereof; preferably said metal oxide comprises a cation derived from a metal selected from the group consisting of Ga, Al, Zn, Sc, Ti, Cr, Zr, Nb, Gd, Nd, Sm and mixtures thereof; more preferably said metal oxide comprises a cation derived from a metal selected from the group consisting of Ga, Al, Zn, Gd, Nd and mixtures thereof; and c) said one or more multi-functional ligands comprising a head group that comprises a material selected from the group consisting of thiols, amines, phosphonic acids, alkoxysilanes, halosilanes, carboxylic acids, nitriles, and mixtures thereof; preferably said one or more multi-functional ligands comprise a head group that comprises a material selected from the group consisting of thiols, phosphonic acids, trialkoxysilanes, trichlorosilanes, and mixtures thereof; more preferably said one or more multi-functional ligands comprise a head group that comprises a material selected from the group consisting of thiols, trialkoxysilanes or phosphonic acids, and one or more additional moieties selected from the group consisting of a hydrosilane, a cyclic ester, an azide, an alcohol, an alkyne, an alkene, an isocyanate, a conjugated diene, an imine, a boronate ester, a conjugated ring, a carboxylic acid, an amine, a thiol, a phosphonic acid, an alkoxysilane, a halosilane, a nitrile and mixtures thereof; preferably said one or more additional moieties is selected from the group consisting of an unsubstituted anthracene, a substituted anthracene, an acrylate, a methacrylate, an epoxide, a ring-strained alkene, an unsubstituted alkene, a terminal alkyne, an acrylamide, a methacrylamide, a norbornene and mixtures thereof; most preferably said one or more multi-functional ligands are selected from the group consisting of 11-phosphonoundecyl acrylate, 3-(trimethoxysilyl)propyl acrylate, 3-(trimethoxysilyl) propyl methacrylate, (3-glycidyloxypropyl) triethoxysilane, 3-(triethoxysilyl)propyl isocyanate, 12-azidododecylphosphonic acid, trimethoxy[2-(7-oxabicyclo [4.1.0]hept-3-yl)ethyl]silane, 3-cyclopentadienylpropyltriethoxysilane, [(5-bicyclo [2.2.1]hept-2-enyl) ethylitriethoxysilane, 11-phosphonoundecanoic acid, and mixtures thereof; when said one or more multi-functional ligands are covalently bound to said shell's external surface and/or coordinatively bound to said liquid metal core's external surface said encapsulates' are chemically bound via a linkage comprising a residue of said ligands of said encapsulates to the external shell of an encapsulate other than the external shell of the encapsulate to which said ligands were originally covalently or coordinatively bound and when said encapsulates do not comprise said multi-functional ligands or when said encapsulates' are not chemically bound via a linkage comprising a residue of said ligands of said encapsulates to the external shell of an encapsulate other than the external shell of the encapsulate to which said ligands were originally covalently or coordinatively bound; said substrate has a mean particle attachment strength of from about 2.8 micro-newtons to about 1 newton, preferably from about 3 micro-newtons to about 0.1 newtons, more preferably from about 6 micro-newtons to about 0.01 newtons, most preferably from about 9 micro-newtons to about 0.001 newtons and a strain at failure of from about 5% to about 10,000%, preferably said substrate has a strain at failure of from about 10% to about 2,000%, more preferably said substrate has a strain at failure of from about 50% to about 800%; preferably about 1% to about 100% of said substrate has a strain at failure of from about 5% to about 10,000%, preferably about 1% to about 100% of said substrate has a strain at failure of from about 10% to about 2,000%, more preferably about 1% to about 100% of said substrate has a strain at failure of from about 50% to about 800%; more preferably about 10% to about 100% of said substrate has a strain at failure of from about 5% to about 10,000%, preferably about 10% to about 100% of said substrate has a strain at failure of from about 10% to about 2,000%, more preferably about 10% to about 100% of said substrate has a strain at failure of from about 50% to about 800%; most preferably about 50% to about 100% of said substrate has a strain at failure of from about 5% to about 10,000%, preferably 50% to about 100% of said substrate has a strain at failure of from about 10% to about 2,000%, more preferably 50% to about 100% of said substrate has a strain at failure of from about 50% to about 800%.

Applicants disclose a substrate according to Paragraph 0017 wherein for said encapsulate:
a) said liquid metal core comprising a liquid metal alloy is selected from the group consisting of Ga/In, Ga/In/Sn, Ga/In/Sn/Sb, In/Sn/Bi, Bi/Pb/Sn, Bi/Pb/Sn/Cd, Bi/Pb/Sn/Cd/In and mixtures thereof; preferably said liquid metal is selected from the group consisting of Ga/In, Ga/In/Sn, Ga/In/Sn/Sb, In/Sn/Bi and mixtures thereof; most preferably said liquid is metal selected from the group consisting of 85.8 atom % Ga/14.2 atom % In, 78.3 atom % Ga/14.9 atom % In/6.8 atom % Sn and mixtures thereof;
b) said shell comprises a metal oxide comprising a cation derived from a metal selected from the group consisting of Ga, Sn, Sb, Cd, Bi, In and mixtures thereof; preferably said metal oxide is selected from the group consisting of Ga, In, Bi and mixtures thereof; and
c) said one or more multi-functional ligands comprises a head group that comprises a material selected from the group consisting of phosphonic acids, trialkoxysilanes, or mixtures thereof; preferably said one or more ligands comprises a head group that comprises a material are selected from the group consisting of phosphonic acids or trialkoxysilanes possessing an acrylate or methacrylate moiety and mixtures thereof; more preferably said one or more multi-functional ligands are selected from the group consisting of 11-phosphonoundecyl acrylate, 3-(trimethoxysilyl)propyl methacrylate and mixtures thereof.

Applicants disclose a substrate according to Paragraphs 0017 through 0018, wherein said encapsulate has a shell thickness of from about 0.5 nanometers to about 5 nanometers.

Applicants disclose a substrate according to Paragraphs 0017 through 0018, wherein said encapsulate has a principal dimension of from about 5 nanometers to about 5 millimeters.

Applicants disclose a substrate according to Paragraphs 0017 through 0020, wherein said linkage has the formula:

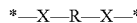

a) each * represents the chemical attachment point to a core shell liquid metal encapsulate;
b) each X represents a molecular segment selected from the group of chemical structures comprising C—S, C—N, C—P—O, C—Si—O, O—Si—O, C—O; preferably said molecular segment is selected from the group of chemical structures comprising thiols, amines, phosphonates, silyl ethers, esters and mixtures thereof; more preferably said molecular segment is selected from the group of chemical structures comprising phosphonates and silyl ethers and mixtures thereof;
c) R represents a molecular segment independently selected from the group of chemical structures comprising C—C, C=C, C—S—C, N—N—N, C—N, O—C—N, C—O—C, Si—O—Si; preferably said molecular segment is selected from the group of chemical structures comprising thioethers, triazoles, dimerized ring systems, urethanes, ethers, esters, amides, tetrahydropyridines, alkanes, aromatics, siloxanes and mixtures thereof; more preferably said molecular segment is selected from the group of chemical structures comprising thioethers, triazoles, urethanes, ethers, amides, carboxylic acid esters, siloxanes and mixtures thereof; most preferably said molecular segment is selected from the group of chemical structures comprising polyethers, polyacrylates, polyacrylamides, polyurethanes, polysiloxanes, thioethers, triazoles, and mixtures thereof.

Applicants disclose a substrate according to Paragraphs 0017 through 0021, wherein said core shell liquid metal encapsulate network comprises, based on total core shell liquid metal encapsulate network mass, from about 88.9% to about 99.99% metal; preferably from about 95% to about 99.99% metal; more preferably from about 99% to about 99.99% metal.

Applicants disclose a substrate comprising a stretchable conductor comprising a liquid metal selected from the group consisting of Hg, Pb, Sn, Sb, Cd, Bi, Ga, In, Al, Zn, Ag, Au, Tl and mixtures thereof; preferably said liquid metal is selected from the group consisting of Ga, In, Sn, Bi, Pb, Cd, Sb and mixtures thereof; more preferably said liquid metal is selected from the group consisting of Ga, In, Sn, Bi, Sb and mixtures thereof; most preferably said liquid metal is selected from the group consisting of Ga, In and mixtures thereof; said stretchable conductor having one or more of the following properties:
a) a conductivity increase of about 5 to about 10 orders of magnitude over an initial elongation of about 1% to about 300%; preferably a conductivity increase of about 7 to about 9 orders of magnitude over an initial elongation of about 50% to about 125%;
b) a repeatable resistance variation of less than 100% over an elongation of about 150% to about 750%; preferably a repeatable resistance variation of less than 50% over an elongation of about 150% to about 300%; more preferably a repeatable resistance variation of less than 25% over an elongation of about 150% to about 300%;
c) a repeatable resistance decrease of greater than 0% to about 20% over a range of elongation from greater than 0% to about 100%, a repeatable resistance decrease of greater than 5% to about 20% over a range of elongation from greater than 0% to about 100%, or a repeatable resistance decrease of greater than 0% to about 10% over a range of elongation from greater than 0% to about 50%.

Applicants disclose a substrate according to Paragraph 0023, wherein said stretchable conductor comprises a core shell liquid metal encapsulate network.

Applicants disclose a substrate according to Paragraph 0024, having an energy induced conductivity gain arising as a result of a geometric deformation of said network's core shell liquid metal encapsulate or core shell liquid metal encapsulate network, preferably said geometric deformation is induced by compression, tension, and/or shear of said network's core shell liquid metal encapsulate or core shell liquid metal encapsulate network.

Applicants disclose a substrate according to Paragraphs 0023 through 0025 comprising a film and/or fiber.

Applicants disclose a substrate according to Paragraphs 0017 through 0026 comprising a power connection, preferably said power connection is selected from an inductive power connection comprising an antenna, a wired power connection, preferably said wired power connection comprises a permanent wired connection, or a temporary wired connection.

Applicants disclose an article comprising a substrate according to Paragraphs 0017 through 0027, said article being a garment, a furniture item, bedding, a vehicle, sporting good, electronic device, safety equipment, medical device, and/or appliance, preferably:
  a) said garment is a coat, shirt, dress, pants, hat, gloves, scarf, socks, shoes, underwear, or belt;
  b) said furniture items is a couch, chair, bed, hammock, mattress, or crib;
  c) said bedding is a blanket, a sheet, a pillow, a comforter, or mattress topper;
  d) said vehicle is a car, a bus, a truck, a plane, a boat, helicopter, or train;
  e) said sporting good is a helmet, racket, sleeping bag, tent, fishing line, climbing gear, ball, sporting gloves, for example, baseball gloves, or parachute;
  f) said electronic device is a strain indicator, mobile phone, tablet, portable computer, visual display, RF antenna, wrist watch, fitness monitor, headphones, earphones, keyboard, computer input device, touch panel, power supply, photovoltaic, photosensor, strain sensor, light-emitting diode array, or GPS transponder;
  g) said safety equipment is a googles, glasses, protective gloves, suits, aprons, helmets, cap, safety or mask;
  h) said medical device is a braces, bandages, tourniquets, sutures, intubation device, intravascular tourniquets, electro muscular stimulator, or electro-lead.

The aforementioned substrate can be incorporated into the article by methodologies such as but not limiting to lamination, adhesive bonding, stitching, hot pressing, buttons, fasteners, snaps, Velcro, or combinations thereof. Such methodologies can be used to incorporate the entire substrate or a portion of the substrate into said article. Further exemplary detail on suitable methodologies can be found in the following granted patents all of which are incorporated by reference in their entry U.S. Pat. Nos. 5,547,531; 6,022,429; 6,174,476 B1; and U.S. Pat. No. 8,323,435 B2.

Process of Making Substrates

Applicants disclose a process of producing a substrate comprising incorporating an encapsulate comprising a liquid metal core and a metal oxide shell that encapsulates said liquid metal core, made by a process comprising:
  a) contacting a liquid metal selected from the group consisting of Hg, Pb, Sn, Sb, Cd, Bi, Ga, In, Al, Zn, Ag, Au, Tl and mixtures thereof, preferably said liquid metal is selected from the group consisting of Ga, In, Sn, Bi, Pb, Cd, Sb and mixtures thereof; more preferably said liquid metal is selected from the group consisting of Ga, In, Sn, Bi, Sb and mixtures thereof; most preferably said liquid is metal selected from the group consisting of Ga, In and mixtures thereof, with one or more multi-functional ligands comprising a material selected from the group consisting of thiols, amines, and mixtures thereof; preferably said one or more multi-functional ligands comprise a material selected from the group consisting of thiols; more preferably said one or more multi-functional ligands comprise a material selected from the group consisting of thiols and one or more moieties selected from the group consisting of a hydrosilane, a cyclic ester, an azide, an alcohol, an alkyne, an alkene, an isocyanate, a conjugated diene, an imine, a boronate ester, a conjugated ring and mixtures thereof; preferably said one or more moieties is selected from the group consisting of an unsubstituted anthracene, a substituted anthracene, an acrylate, a methacrylate, an epoxide, a ring-strained alkene, an unsubstituted alkene, a terminal alkyne, an acrylamide, a methacrylamide, a norbornene and mixtures thereof; and/or
  b) contacting at least a portion of said metal oxide shell with one or more multi-functional ligands comprising a material selected from the group consisting of phosphonic acids, alkoxysilanes, halosilanes, carboxylic acids and mixtures thereof; preferably said one or more multi-functional ligands comprise a material selected from the group consisting of phosphonic acids, trialkoxysilanes, trichlorosilanes, and mixtures thereof; more preferably said one or more multi-functional ligands comprise a material selected from the group consisting of trialkoxysilanes or phosphonic acids, and one or more moieties selected from the group consisting of a hydrosilane, a cyclic ester, an azide, an alcohol, an alkyne, an alkene, an isocyanate, a conjugated diene, an imine, a boronate ester, a conjugated ring and mixtures thereof; preferably said one or more moieties is selected from the group consisting of an unsubstituted anthracene, a substituted anthracene, an acrylate, a methacrylate, an epoxide, a ring-strained alkene, an unsubstituted alkene, a terminal alkyne, an acrylamide, a methacrylamide, a norbornene and mixtures thereof; most preferably said one or more ligands are selected from the group consisting of 11-phosphonoundecyl acrylate, 3-(trimethoxysilyl)propyl acrylate, 3-(trimethoxysilyl)propyl methacrylate, (3-glycidyloxypropyl) triethoxysilane, 3-(triethoxysilyl)propyl isocyanate, 12-azidododecylphosphonic acid, trimethoxy[2-(7-oxabicyclo[4.1.0]hept-3-yl)ethyl]silane, 3-cyclopentadienylpropyltriethoxysilane, [(5-bicyclo[2.2.1]hept-2-enyl)ethyl]triethoxysilane and mixtures thereof;
  c) optionally agitating and/or heating the combination formed in a) and/or b), preferably said agitation is sufficient to prevent sedimentation of said encapsulates and the temperature of said combination formed in a) and/or b) is maintained at a temperature of from about 45° C. to about 60° C. for a time of about two to about four hours;
  d) optionally, removing unbound ligands by dialysis with a solvent and/or by several iterations of centrifugation and washing;

e) optionally, suspending the core shell liquid metal encapsulates in fresh solvent.

Applicants disclose a process according to Paragraph 0029 wherein one, two or three of the following steps are preformed:
a) the combination formed in a) and/or b) of Paragraph 0026 is agitated and/or heated, preferably said agitation is sufficient to prevent sedimentation of said encapsulates and the temperature of said combination formed in a) and/or b) of Paragraph 0026 is maintained at a temperature of from about 45° C. to about 60° C. for a time of about two to about four hours;
b) unbound ligands are removed by dialysis with a solvent and/or by several iterations of centrifugation and washing;
c) the core shell liquid metal encapsulates are suspended in fresh solvent.

Applicants disclose a process of producing a substrate comprising incorporating a core shell liquid metal encapsulate network comprising a plurality of core shell liquid metal encapsulates comprising multi-functional ligands, said process comprising stimulating said multi-functional ligands by imparting energy to said ligands and/or combining said multi-functional ligands with one or more initiators; preferably said energy is imparted by electromagnetic radiation, heat, or mechanical stimulus and preferably said one or more initiators is selected from the group consisting of photoradical initiators, thermoradical initiators, mechanoradical generators, photoacid generators, thermal acid generators, mechano-acid generators, poly-azido molecules, poly-alkyne molecules, poly-thiol molecules, poly-alkene molecules, polyols, poly-isocyanates, copper compounds, ruthenium compounds, silver compounds, and reducing organic acids and more preferably, said energy is imparted by electromagnetic radiation or heat and preferably said one or more initiators is selected from the group consisting of photoradical initiators, photoacid generators, thermal acid generators, poly-alkyne molecules, poly-alkene molecules, polyols, copper compounds, ruthenium compounds, and reducing organic acids; most preferably, said energy is imparted by electromagnetic radiation and more preferably said one or more initiators is selected from the group consisting of photoradical initiators, photoacid generators, poly-alkyne molecules, polyols, copper compounds, and ascorbic acid.

Applicants disclose a process according to Paragraph 0031, wherein said core shell liquid metal encapsulates comprising multi-functional ligands are suspended in a continuous liquid phase prior to being stimulated and optionally deposited on a substrate and optionally dried on said substrate.

Methods

Applicants disclose a method of heating an article said method comprising subjecting a substrate of an article according to Paragraph 0028 to alternating current, direct current and/or a time varying electromagnetic field with the proviso that said substrate is not simultaneously subjected to direct current and alternating and when said article's substrate is subjected to direct current or alternating current, said substrate comprising an electrical connection that is connected to an alternating current or direct current power source, preferably said article's substrate is subjected to direct current, preferably when said substrate is subjected to a time varying electromagnetic field said article comprises an inductor that is subjected to said time varying electromagnetic field, said inductor being physically connected to said substrate.

Applicants disclose a method of providing a power transmission capability to an article, said method comprising incorporating a substrate according to Paragraphs 0017 through 0027 into and/or on said article.

Applicants disclose a method of measuring maximum experienced strain, said method comprising determining the change in resistance, capacitance and/or inductance of a substrate according to Paragraphs 0017 through 0027 and comparing said change in resistance, capacitance and/or inductance to a calibration curve of maximum strain versus resistance, capacitance and/or inductance.

Applicants disclose a method of changing the shape of an article comprising a substrate according to Paragraphs 0017 through 0027, said method comprising manipulating said article's shape when said substrate's liquid metal is above said liquid metal's solidus and passively and/or actively cooling said substrate to a temperature below said liquid metal's solidus, optionally repeating said method one or more times.

Test Methods

Determination of Encapsulate Principal Dimension

Preparation of Sizing Encapsulates in the Size Range of 10 nanometers to 500 nanometers.

Encapsulates are sized using high-resolution scanning transmission electron microscope (STEM) images taken with a high-angle annular dark-field detector on a transmission electron microscope operating at an accelerating voltage of 200,000 electron volts. Encapsulate particles are mounted for STEM measurements by first adding 50 microliters of a given encapsulate suspension having an encapsulate concentration range between $1*10^{-5}$ and $1*10^{-4}$ millimolar to 2 milliliters of dichloromethane followed by dropping this diluted suspension onto a 400-mesh copper, carbon-film coated transmission electron microscopy grid held in self-closing, anti-capillary tweezers until a single drop falls from the grid. Following deposition, a folded piece of filter paper is used to wick excess solvent from the grid underside.

Preparation of Sizing Encapsulates in the Size Range of 501 nanometers to 5,000,000 nanometers (5 millimeters).

The encapsulates are prepared for measurement by first drop casting films on copper tape and coating the encapsulates in 10 nanometers of iridium. Encapsulates are characterized using scanning electron microscopy (SEM) at an accelerating voltage of 1000 volts and with an aperture of 20 micrometers.

ImageJ software (freely available from the National Institute of Health) is used to open images corresponding to each sample and to manually draw lines bisecting encapsulates along their longest dimension, followed by recording the length of each line drawn. This process is repeated for at least 300 encapsulates in each sample. Following measurement, the average diameter and surface-area weighted average diameter are calculated from the tabulated data.

Shell Thickness—Scanning Transmission Electron Microscopy (STEM)

STEM images of encapsulate particles are processed using the "Find Edges" routine built into the software package ImageJ which uses a Sobel image filter to highlight spatial changes in image contrast. As STEM images provide contrast based on the atomic number of the elements imaged, oxide shells typically have a difference in signal from the encapsulate core and any adventitious carbon overlayer. The "Find Edges" function reveals two lines surrounding the encapsulate; one line corresponds to the shell inner edge and one line corresponds to the shell outer edge. An intensity profile is generated within ImageJ by drawing a line which perpendicularly bisects the shell inner and outer edges followed by selection of the "Plot Profile" function. A line is then drawn on the resultant profile between the intensity maxima and a measurement taken of this distance. 50 of these measurements are taken and averaged to calculate the average encapsulate shell thickness.

Shell Thickness—X-Ray Photoelectron Spectroscopy (XPS)

XPS measurements of encapsulate oxide shell thicknesses are produced as follows. Two films for XPS are produced by spin-coating a first encapsulate sample dispersed in absolute ethanol at 2000 RPM onto substrates consisting of single-sided copper adhesive tape affixed to a 1 centimeter×1 centimeter piece of glass and a second encapsulate sample dispersed in anhydrous chlorobenzene at 2000 RPM onto substrates consisting of single-sided copper adhesive tape affixed to a 1 centimeter×1 centimeter piece of glass. The encapsulate suspension is deposited dropwise onto the spinning substrate until the layer has thickened such that the copper foil is no longer visible through the encapsulate film. Encapsulate suspensions are vortex mixed for 30 seconds immediately prior to deposition to ensure homogeneity. Optical profilometry is used to determine the root mean square (RMS) roughness for each film. The film having the lower root mean square roughness is introduced into the XPS within 30 minutes to preclude significant oxidation in air, with XPS measurements commencing within 90 minutes.

All XPS spectra are collected using a monochromated Al source. First, ideal measurement regions are identified for each core and shell forming element present. These regions are selected to achieve as low of a binding energy as possible (to permit deep photoelectron escape) while still remaining deconvolutable from other elemental regions present. If it is necessary to perform deconvolution of elemental regions which overlap with other elemental regions, an independent, non-convoluted region is be chosen for the second element and used to constrain the peak-fit of the first element during software peak-fitting. High-resolution XPS spectra are then collected from each of these regions. In addition to collection of regions corresponding to metallic core/shell constituting elements present, a survey spectrum, the O1s region, and the C1s region are also collected.

To calculate the absolute thickness of the metal oxide shell surrounding the liquid metal core of the encapsulates, the following approach is used. First, the particle sizes are determined as previously described, and are reweighted to provide a surface-area weighted average which is used in these calculations. The identity of the core material is assumed based on redox and kinetic considerations, which may be bolstered by preliminary XPS analysis to determine the principal core and shell-forming elements present. The metal oxide shell is assumed to be stoichiometric for whatever oxide-forming element is present and the organic shell overlayer is assumed to have an atomic number of Z=4. The core is assumed to be constituted of the bulk alloy used to form the encapsulate. If spin-orbit components for a given elemental transition are convoluted, both are fitted by constraining the more convoluted peak area to the less convoluted peak area using spin-orbit splitting rules. If peaks due to spin-orbit splitting are not convoluted for a given elemental transition, only the larger peak is fitted. If multiple peaks arising from the same element are present in one transition (due to chemical state differences), all peaks are constrained to have identical full-width, half-maximum values. Values for binding energy shift may be taken from the NIST XPS Database to assist in deconvolution of multiple chemical states present in a given elemental transition, if necessary. If multiple values for the binding energy shift for a given chemical state of an element are present in the NIST XPS Database, the median value is used as the value for the binding energy shift. If no value is present in the NIST XPS Database for a given chemical state in a specific, desirable elemental transition, other literature values may be sought. Finally, appropriate lineshapes and background fits should be used, based on the manufacturer's specifications for the instrument.

Following tabulation of raw peak areas, these raw data are corrected based on the relative sensitivity factors for each elemental transition collected, based on published values from the manufacturer of the x-ray photoelectron spectrometer. Next, one of these corrected signals is selected which originates only from the core, one is selected which originates only from the oxide shell, and the C1s signal is assumed to originate only from the ligands and adventitious carbon overlayer. To prepare for shell thickness calculation, the following quantities are calculated:

$$L_{1,1} = 0.316 a_1^{3/2} \left\{ \frac{E_1}{Z_1^{0.45}[\ln(E_1/27)+3]} + 4 \right\}$$

$$B_{2,1} = (E_2/E_1)^{0.872}$$

$$B_{2,0} = (E_2/E_0)^{0.872}$$

$$C_{2,0} = (Z_2/Z_0)^{0.3}$$

$$C_{2,1} = (Z_2/Z_1)^{0.3}$$

$$L_{2,2} = L_{1,1}/(B_{2,1}C_{2,1})$$

where $L_{1,1}$ represents the photoelectron attenuation length of a photoelectron of material 1 (oxide shell material) passing through material 1, $a_1$ represents the atomic size of material 1 in nanometers which for purposes of this test methods is 0.25 nanometers in all metal oxide cases, $E_i$ represents the photoelectron energy in electron volts of the photoelectron from material i, and $Z_i$ represents the number averaged atomic number for material i, where i may be 0 for the liquid core, 1 for the oxide shell, and 2 for the carbonaceous overlayer. B and C are useful parameters for later calculations, and describe the relative opacity of each layer (core, oxide shell, carbonaceous overlayer) in the encapsulate. Next, the photoelectron attenuation length for photoelectrons originating from material 2 passing through material 2, $L_{2,2}$, is calculated. Finally, starting from the relative sensitivity factor corrected peak areas, the following quantities are calculated:

$$A_{1,0}=I_1/I_0$$

$$A_{2,1}=I_2/I_1$$

$$A_{2,0}=I_2/I_0$$

where $A_{i,j}$ represents the ratio of the photoelectron signal originating from material i to that originating from material j, and $I_i$ represents the relative sensitivity factor corrected photoelectron signal originating from material i.

To calculate the oxide shell thickness, $T_1$, and the carbonaceous overlayer thickness, $T_2$, the following iterative procedure is employed. $T_2$ is, for purposes of this test method, 0.1 nanometers. This value is converted into attenuation-length scaled units by dividing by $L_{2,2}$. Next, the value $A^*_{1,0}$ is calculated according to the equation:

$$A^*_{1,0} = A_{1,0}\{1+n[\ln(T_2+1)]\}e^{[(B_{2,1}-B_{2,0})T_2]}$$

where $$n = \tfrac{1}{20}[(2B_{2,1}-B_{2,0})(4.5+C_{2,1})+2(B_{2,0}-1)C_{2,1}+4.6]$$

followed by conversion of particle radius, R, from units of absolute length (nanometers or similar) to photoelectron attenuation length scale by division by $L_{1,1}$. Finally, a value for the oxide shell thickness, $T_1$, is calculated via the following set of equations:

$$T_{R\to\infty} = \frac{0.74A^{3.6}\ln(A)B^{-0.9} + 4.2AB^{-0.41}}{A^{3.6} + 8.9}$$

$$T_0 = R_{NP}\left[(ABC+1)^{\frac{1}{3}} - 1\right]$$

$$\alpha = \frac{1.8}{A^{0.1}B^{0.5}C^{0.4}}$$

$$\beta = \frac{0.13\alpha^{2.5}}{R_{NP}^{1.5}}$$

$$T_{R-1} = \frac{T_{R\to\infty}R}{R_{NP}+\alpha}$$

$$T_1 = \frac{T_{R\to\infty}+\beta T_0}{1+\beta}$$

where $$B = \frac{B_{2,0}}{B_{2,1}}$$

$$C = \frac{C_{2,0}}{C_{2,1}}$$

$$A = A^*_{1,0}$$

$$R_{NP} = R + T_1$$

The value for $T_1$ calculated in this manner is then converted from units of $L_{1,1}$ to units of $L_{2,2}$ by multiplying by $L_{2,2}/L_{1,1}$. Next, the following quantities are calculated:

$$A_{eff} = \frac{A_{2,1}A_{2,0}}{A_{2,1}+A_{2,0}}$$

$$B_{eff} = wB_{2,1} + (1-w)B_{2,0}$$

$$C_{eff} = wC_{2,1} + (1-w)C_{2,0}$$

where $$w = \frac{A_{1,0}}{A_{1,0}+0.8+0.5B_{1,0}^4}$$

Next, the value for particle radius, R, is converted into units of $L_{2,2}$ by dividing R by $L_{2,2}$. Finally, a new value for $T_2$ is calculated via the following equations:

$$T_{R\to\infty} = \frac{0.74A^{3.6}\ln(A)B^{-0.9} + 4.2AB^{-0.41}}{A^{3.6} + 8.9}$$

$$T_0 = R_{NP}\left[(ABC+1)^{\frac{1}{3}} - 1\right]$$

$$\alpha = \frac{1.8}{A^{0.1}B^{0.5}C^{0.4}}$$

$$\beta = \frac{0.13\alpha^{2.5}}{R_{NP}^{1.5}}$$

$$T_{R-1} = \frac{T_{R\to\infty}R}{R_{NP}+\alpha}$$

$$T_2 = \frac{T_{R\to\infty}+\beta T_0}{1+\beta}$$

where $A = A_{eff}$ $B = B_{eff}$ $C = C_{eff}$ $R_{NP} = R + T_1$ and $R_{NP}$, R, and $T'_1$ are expressed in units of $L_{2,2}$.

To converge on consistent values for $T_1$, the oxide shell thickness, and $T_2$, the carbonaceous shell thickness, the above procedure for calculating $T_1$ and $T_2$ is iterated on until the values for $T_1$ and $T_2$ converge across two cycles wherein the deviation between the two cycles is less than 0.01%. These values are then taken as the actual absolute thicknesses of the oxide shell and carbonaceous overlayer.

Conductivity Under Elongation

Stretchable conductor traces are prepared on taped sections of flat 2-hydroxyethyl acrylate substrates to produce a rectangular geometry (10 millimeters length by 4 millimeters wide with a thickness between 0.01 and 0.15 millimeters). Trace dimensions are measured using an optical profilometer and the thickness is calculated by comparing the average height of the trace to the average height of the underlying substrate. The direct-current electrical resistance is taken as an average of ten measurements using a four-point probe method taken from the center of the sample with a probe spacing of 1 millimeter. The conductivity is calculated using initial geometries and a correction factor for a thin rectangular section shown below:

$$\sigma = \frac{\ln 2}{\pi} \cdot \frac{1}{t} \cdot \frac{1}{0.7115} \cdot R$$

where $\sigma$ is the conductivity, t is the thickness of the sample, and R is the measured resistance.

Single-sided copper adhesive tape is adhered directly onto the traces at each end, overlapping the encapsulate network by 2 millimeters to ensure good contact across the trace width. A single droplet of liquid metal (50 microliters) is spotted on the interfaces between the copper tape and stretchable conductor trace to further enhance electrical contact and retain said contact throughout the test, especially at high strains.

Electromechanical testing is performed using a lead-screw driven biaxial stretching platform. Experiments are performed in uniaxial mode with an integrated, inline 10 newton tensile load cell (resolution=±0.05 newtons). Horizontally opposed, self-tightening grips comprising a metallic body, with a uniform clamping force from an internally mounted torsion spring, are used to mount the samples. Test samples are clamped at the inner edges of the copper tape.

Electrical leads are connected to the metallic grips using alligator-style clips. Prior to the application of tensile strain, test samples are preloaded to 0.1 newtons to remove any slack in the sample length. Experiments are performed at a linear applied strain rate of 300 millimeters per minute.

In situ direct-current two-wire electrical resistance measurements are recorded using a digital multimeter and data acquisition system. The baseline resistance of the system with no sample present is subtracted from the measured resistances during testing. As the measured length (L) of a sample increases, a reciprocal decrease in cross-sectional area (A) of the trace is assumed such that the product L*A is constant. The relative conductivity (C) is calculated from the measured resistance (R) at a given strain using the equation:

$$C = \frac{L}{R \cdot A}$$

A correction factor is determined such that the zero strain state conductivity is equivalent to the conductivity measured from the previous 4-point probe measurement. The conductivity at a given strain is calculated by multiplying the relative conductivity (C) against this correction factor.

Repeatable Resistance Variation and Decrease

The repeatability of both resistance variation and decrease are determined through monotonic and cyclic electromechanical experiments. Test samples consisting of single traces (15 millimeters×4 millimeters×0.1 millimeters) of stretchable conductor networks drop cast across the gauge length (20 millimeters×4 millimeters) of 2-hydroxyethyl acrylate 'dog-bone' tensile specimens are used. Single-sided copper adhesive tape (3M, ¼ inch width) is adhered directly onto the trace at each end, overlapping the encapsulate network a few millimeters to ensure good contact across the trace width. A single droplet of liquid metal (50 microliters) is spotted on the interfaces between the copper tape and stretchable conductor trace to further enhance electrical contact and retain said contact throughout the test, especially at high strains.

Electromechanical testing is performed using a lead-screw driven biaxial stretching platform. Experiments are performed in uniaxial mode with an integrated, inline 10 newton tensile load cell (resolution=±0.05 newtons). Horizontally opposed, self-tightening grips comprising a metallic body, with a uniform clamping force from an internally mounted torsion spring, are used to mount the samples. Test samples are clamped at the edges of the copper tape. Electrical leads are connected to the metallic grips using alligator-style clips. Prior to the application of tensile strain, test samples are preloaded to 0.1 newtons to remove any slack in the sample length. Experiments are performed at a linear applied strain rate of 300 millimeters per minute.

In situ direct-current two-wire electrical resistance measurements are recorded using a digital multimeter and data acquisition system. The baseline resistance of the system with no sample present is subtracted from the measured resistances during testing. Cyclic tests to determine repeatability are performed to 1000 strain cycles.

Calculation of Particle Attachment Strength

To calculate the mean particle attachment strength, $F_{s,p}$, in newtons, the mean contact area, $A_{contact}$ in nanometers squared ($nm^2$), between the particle population and the substrate is first calculated as:

$$A_{contact} = (d_{ave} * 1.5 - 1.5^2)$$

where $d_{ave}$ is the geometric mean particle diameter in nanometers. The mean particle attachment strength in newtons, can then be calculated as:

$$F_{s,p} = \sigma_{s,p} A_{contact}$$

where $\sigma_{s,p}$ in kilopascals, is the normal tensile adhesive strength for the particle substrate system as measured by ASTM D-897 using aluminum contacts.

Calculation of Strain at Failure

Tensile testing is performed using a lead-screw driven biaxial stretching platform. Experiments are performed in uniaxial mode with an integrated, inline 10 newton tensile load cell (resolution=±0.05 newtons). Horizontally opposed, self-tightening grips comprising a metallic body, with a uniform clamping force from an internally mounted torsion spring, are used to mount the samples. Test samples consist of ASTM D638-14 Type V dogbones and are tested according to ASTM D638-14. Prior to the application of tensile strain, test samples are preloaded to 0.1 newtons to remove any slack in the sample length. The strain at failure, in units of percent, is calculated by dividing the change in gauge length at the point of specimen rupture by the initial gauge length and multiplying by 100.

EXAMPLES

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

Example 1 Production of 11-Phosphonoundecyl Acrylate Functionalized EGaIn Liquid Metal Encapsulates. Gallium and Indium were combined to produce a eutectic liquid alloy of GaIn (14.2 atom % In, 85.8 atom % Ga). A total of 9 milligrams of the ligand 11-phosphonoundecyl acrylate was dissolved in 10 milliliters of ethanol (200 proof, anhydrous USP) and added to a 20 milliliters glass vial containing 200 milligrams of the GaIn alloy. The mixture was sonicated in an ultrasonic bath at 45° C. for two hours to produce GaIn particles having a number average diameter of about 3 microns. The resulting colloidal solution was centrifuged at 2600 RCF for 3 minutes and the supernatant was removed and replaced. This process was repeated three times, after which the particles were suspended in 4 milliliters of ethanol.

Example 2 Production of 12-Azidododecylphosphonic acid Functionalized EGaIn Liquid Metal Encapsulates. To produce nanoscale EGaIn-based liquid metal encapsulates functionalized with 12-azidododecylphosphonic acid, a multi-functional ligand molecule, 0.1 milliliters of EGaIn (14.2 atom % In, 85.8 atom % Ga) was placed into a 20 milliliters, 28 millimeters outer diameter borosilicate glass scintillation vial containing 14.9 milliliters absolute ethanol. A 3 millimeters ultrasonic probe microtip driven by a Sonics and Materials, Inc. VCX500 ultrasonic processor was then immersed approximately half of the vial height into the ethanol. Parafilm was then used to seal the vial opening as completely as possible to minimize solvent loss during ultrasonication. Sonication was then carried out for two hours at an amplitude of 17% while the vial temperature was held constant at a temperature of 10° C. using a water bath to produce nanoscale EGaIn particles having a number average diameter of about 160 nanometers. Following ultrasonication, the vial of EGaIn encapsulate suspension was removed from the ultrasonication apparatus and 17 milligrams of 12-azidododecylphosphonic acid was added to the vial. The vial was then sealed with its cap and placed into a bath sonicator held at a temperature of 45° C. and sonicated for 30 minutes to bond phosphonic acid ligands to the EGaIn particle surface. Following the ligand attachment step, excess ligands were removed from solution by a series of centrifugation and washing steps where the particle suspension was placed into a centrifugation tube and spun at 8229 RCF for 20 minutes, after which the supernatant is decanted and the encapsulate sediment is redispersed into a 3:1 (v:v) mixture of chlorobenzene:methanol. This process is repeated three times before a final redispersion of the encapsulate particles into 3:1 chlorobenzene:methanol.

Example 3 Production of (3-glycidyloxypropyl) triethoxysilane Functionalized EGaIn Liquid Metal Encapsulates. (3-glycidyloxypropyl) triethoxysilane functionalized EGaIn liquid metal encapsulates were produced in the same way as 12-azidododecylphosphonic acid functionalized encapsulates, except, 1 milliliter of (3-glycidyloxypropyl) triethoxysilane was used per 10 milliliters of solvent and the particle suspension was stirred at ambient temperature for 16 hours after addition, rather than 30 minutes of bath sonication. Excess ligand was removed from solution by three centrifugation/wash steps at 8229 RCF for 20 minutes with chlorobenzene. The final particles produced in this manner were redispersed into chlorobenzene for later use.

Example 4 Production of 11-Mercaptoundecanoic acid Functionalized EGaIn Liquid Metal Encapsulates. 11-mercaptoundecanoic acid functionalized particles were made by placing 0.1 milliliters of EGaIn liquid metal into a 20 milliliters, 28 millimeters outer diameter borosilicate scintillation vial. To this vial was added 14.9 milliliters of a 64 millimolar solution of 11-mercaptoundecanoic acid in absolute ethanol. A 3 millimeter ultrasonic probe microtip driven by a Sonics and Materials, Inc. VCX500 ultrasonic processor was then immersed approximately half of the vial height into the ethanol. Parafilm was then used to seal the vial opening as completely as possible to minimize solvent loss during ultrasonication. Sonication was then carried out for sixteen hours at an amplitude of 30% while the vial temperature was held constant at a temperature of 10° C. using a water bath to produce nanoscale EGaIn particles having a number average diameter of about 60 nanometers. Excess ligand was removed from solution by a series of centrifugation/redispersion steps in which the particle suspension was centrifuged at 8229 RCF for 30 minutes to sediment the particles, followed by redispersion in fresh absolute ethanol. These steps were repeated three times before a final redispersion into absolute ethanol. Particles produced in this manner had a number averaged diameter of about 60 nanometers and a gallium oxide shell thickness of about 1.2-1.3 nanometers.

Example 5 Production of 4-Aminophenyl propargyl ether Functionalized EGaIn-based Liquid Metal Encapsulates. 4-Aminophenyl propargyl ether functionalized EGaIn particles are made as in Example 4 for EGaIn particles functionalized with 11-mercaptoundecanoic acid, except, 4-aminophenyl propargyl ether is substituted for 11-mercaptoundecanoic acid wherever 11-mercaptoundecanoic acid is used in the procedure.

Example 6 Production of 12-Azidododecylphosphonic acid Functionalized Ga—In—Sn Alloy Liquid Metal Encapsulates. Ga—In—Sn alloy (68.5 wt % Ga, 21.5 wt % In, 10 wt % Sn) liquid metal particles functionalized with 12-azidododecylphosphonic acid are made as in Example 2 for EGaIn particles functionalized with 12-azidododecylphosphonic acid, except, Ga—In—Sn alloy (68.5 wt % Ga, 21.5 wt % In, 10 wt % Sn) liquid metal is substituted for EGaIn wherever EGaIn is used.

Example 7 Production of (3-glycidyloxypropyl) triethoxysilane Functionalized Ga—In—Sn Alloy Liquid Metal Encapsulates. Ga—In—Sn alloy (68.5 wt % Ga, 21.5 wt % In, 10 wt % Sn) liquid metal particles functionalized with (3-glycidyloxypropyl) triethoxysilane are made as in Example 3 for EGaIn particles functionalized with (3-glycidyloxypropyl) triethoxysilane, except, Ga—In—Sn alloy (68.5 wt % Ga, 21.5 wt % In, 10 wt % Sn) liquid metal is substituted for EGaIn wherever EGaIn is used.

Example 8 Production of 11-Mercaptoundecanoic acid Functionalized Ga—In—Sn Alloy Liquid Metal Encapsulates. Ga—In—Sn alloy (68.5 wt % Ga, 21.5 wt % In, 10 wt % Sn) liquid metal particles functionalized with 11-mercaptoundecanoic acid were made as in Example 4 for EGaIn particles functionalized with 11-mercaptoundecanoic acid, except, Ga—In—Sn alloy (68.5 wt % Ga, 21.5 wt % In, 10 wt % Sn) liquid metal is substituted for EGaIn wherever EGaIn is used.

Example 9 Production of 4-Aminophenyl propargyl ether Functionalized Ga—In—Sn Alloy Liquid Metal Encapsulates. Ga—In—Sn alloy (68.5 wt % Ga, 21.5 wt % In, 10 wt % Sn) liquid metal particles functionalized with 4-aminophenyl propargyl ether are made as in Example 5 for EGaIn particles functionalized with 4-aminophenyl propargyl ether, except, Ga—In—Sn alloy (68.5 wt % Ga, 21.5 wt % In, 10 wt % Sn) liquid metal is substituted for EGaIn wherever EGaIn is used.

Example 10 Production of 12-Azidododecylphosphonic acid Functionalized Field's metal Liquid Metal Encapsulates. Field's metal (32.5 wt % Bi, 51 wt % In, 16.5 wt % Sn) liquid metal particles functionalized with 12-azidododecylphosphonic acid are made as in Example 2 for EGaIn particles functionalized with 12-azidododecylphosphonic acid, except, Field's liquid metal alloy is substituted for EGaIn wherever EGaIn is used, the bath temperature for ultrasonication is held at 65° C., and ethylene glycol is used as solvent in place of ethanol.

Example 11 Production of (3-glycidyloxypropyl) triethoxysilane Functionalized Field's metal Liquid Metal Encapsulates. Field's metal (32.5 wt % Bi, 51 wt % In, 16.5 wt % Sn) liquid metal particles functionalized with (3-glycidyloxypropyl) triethoxysilane are made as in Example 3 for EGaIn particles functionalized with (3-glycidyloxypropyl) triethoxysilane, except, Field's liquid metal alloy is substituted for EGaIn wherever EGaIn is used, the bath temperature for ultrasonication is held at 65° C., and ethylene glycol is used as solvent in place of ethanol.

Example 12 Production of 11-Mercaptoundecanoic acid Functionalized Field's metal Liquid Metal Encapsulates. Field's metal (32.5 wt % Bi, 51 wt % In, 16.5 wt % Sn) liquid metal particles functionalized with 11-mercaptoundecanoic acid are made as in Example 4 for EGaIn particles functionalized with 11-mercaptoundecanoic acid, except, Field's liquid metal alloy is substituted for EGaIn wherever EGaIn is used, the bath temperature for ultrasonication is held at 65° C., and ethylene glycol is used as solvent in place of ethanol.

Example 13 Production of 4-Aminophenyl propargyl ether Functionalized Field's metal Liquid Metal Encapsulates. Field's metal (32.5 wt % Bi, 51 wt % In, 16.5 wt % Sn) liquid metal particles functionalized with 4-aminophenyl propargyl ether are made as in Example 5 for EGaIn particles functionalized with 4-aminophenyl propargyl ether, except, Field's liquid metal alloy is substituted for EGaIn wherever EGaIn is used, the bath temperature for ultrasonication is held at 65° C., and ethylene glycol is used as solvent in place of ethanol.

Example 14 Production of Covalently-linked Triazole-containing Networks from 12-Azidododecylphosphonic acid Functionalized EGaIn Liquid Metal Encapsulates. 12-Azidododecylphosphonic acid functionalized EGaIn liquid metal encapsulates are produced as described in Example 2. To this particle suspension is added 6.18 microliters of propargyl ether, followed by the addition of 2.4 milligrams sodium ascorbate and 1 milligram of copper(II) sulfate pentahydrate. This mixture is then pipetted onto a stretchable substrate and allowed to dry before activation of the electrical conductivity of the network via stretching.

Example 15 Production of 3-(Trimethoxysilyl)propyl Methacrylate Functionalized EGaIn Liquid Metal Encapsulates. 3-(trimethoxysilyl)propyl methacrylate functionalized EGaIn liquid metal encapsulates were produced in the same way as Example 1, except, 1 milliliter of 3-(trimethoxysilyl) propyl methacrylate was used in place of 9 milligrams of 11-phosphonoundecyl acrylate.

Example 16 Production of Cross-linked Particle Networks in Ethanol based on 11-Phosphonoundecyl Acrylate Functionalized EGaIn Liquid Metal Encapsulates. 3 milligrams of photoinitiator phenylbis(2,4,6-trimethylbenzoyl) phosphine oxide was added to a 4 milliliter solution of ethanol and 200 milligrams of eutectic GaIn particles functionalized with 11-phosphonoundecyl acrylate according to Example 1. The mixture was exposed to 94.125 milliwatts per square centimeter of 365 nanometer wavelength light for 180 seconds to cross-link particles together and form a network.

Example 17 Production of Cross-linked Particle Networks in DMSO based on 11-Phosphonoundecyl Acrylate Functionalized EGaIn Liquid Metal Encapsulates. 4 milligrams of photoinitiator phenylbis(2,4,6-trimethylbenzoyl) phosphine oxide was added to a 2 milliliter solution of DMSO and 200 milligrams of eutectic GaIn particles functionalized with 11-phosphonoundecyl acrylate according to Example 1. The mixture was exposed to 94.125 milliwatts per square centimeter of 365 nanometer wavelength light for 180 seconds to cross-link particles together and form a network.

Example 18 Production of Substrate Bound Cross-linked Particle Networks based on 11-Phosphonoundecyl Acrylate Functionalized EGaIn Liquid Metal Encapsulates. 3 milligrams of photoinitiator phenylbis(2,4,6-trimethylbenzoyl) phosphine oxide was added to a 4 milliliter solution of ethanol and 200 milligram of eutectic GaIn particles functionalized with 11-phosphonoundecyl acrylate according to Example 1. This solution was drop cast onto an elastomer substrate comprising 2-hydroxyethyl acrylate. When the agglomerate appeared visually dry, 365 nanometer wavelength light was irradiated from underneath the substrate for 180 seconds at an intensity of 94.125 milliwatts per square centimeter to cross-link the particles into a network which also has linkages to the elastomer substrate.

Example 19 Production of Substrate Bound Cross-linked Particle Networks based on 3-(Trimethoxysilyl)propyl Methacrylate Functionalized EGaIn Liquid Metal Encapsulates. 4 milligrams of photoinitiator phenylbis(2,4,6-trimethylbenzoyl)phosphine oxide was added to a 2 milliliters solution of ethanol and 200 milligrams of eutectic GaIn particles functionalized with 3-(trimethoxysilyl)propyl methacrylate according to Example 15. This solution was drop cast onto an elastomer substrate comprising 2-hydroxyethyl acrylate. When the agglomerate appeared visually dry, 365 nanometer wavelength light was irradiated from underneath the substrate for 180 seconds at an intensity of 94.125 milliwatts per square centimeter to cross-link the particles into a network which also has linkages to the elastomer substrate.

Example 20 Production of Cross-linked Particle Networks in Tetrahydrofuran based on (3-Glycidyloxypropyl) Triethoxysilane Functionalized EGaIn Liquid Metal Encapsulates. 2 milligrams of a 50 wt % solution of photoinitiator triarylsulfonium hexafluoroantimonate in propylene carbonate is added to a 4 milliliter solution of tetrahydrofuran and 200 milligrams of eutectic GaIn particles functionalized with (3-glycidyloxypropyl) triethoxysilane prepared according to Example 3. This solution is exposed to 94.125 milliwatts per square centimeter of 365 nanometer wavelength light for 180 seconds to cross-link particles together.

Example 21 Production of Activated Particle Networks based on 11-Phosphonoundecyl Acrylate Functionalized EGaIn Liquid Metal Encapsulates in Ethanol. Cross-linked particle networks prepared according to Example 16 were drop cast onto an elastomer substrate comprising 2-hydroxyethyl acrylate and the solvent was allowed to dry. When the substrate was stretched, a conductivity increase of about 7 to about 9 orders of magnitude was observed in the particle network over a uniaxial elongation of about 50% to 125%. After 10 iterations of uniaxial stretching to 300% elongation and back these particle networks were observed to have a conductivity of about 800 Siemens per centimeter. After 10 iterations of uniaxial stretching to 300% elongation and back, a repeatable resistance variation of less than 100% was observed while elongating to about 750% elongation.

Example 22 Production of Activated Particle Networks based on 11-Phosphonoundecyl Acrylate Functionalized EGaIn Liquid Metal Encapsulates in DMSO. Cross-linked particle networks prepared according to Example 17 were drop cast onto an elastomer substrate comprising 2-hydroxyethyl acrylate and the system was heated until dry. When the substrate was stretched, a conductivity increase of about 7 to about 9 orders of magnitude was observed in the particle network over a uniaxial elongation of about 50% to 125%. After 10 iterations of uniaxial stretching to 200% elongation and back these particle networks were observed to have a conductivity of about 2500 Siemens per centimeter. After 10 iterations of uniaxial stretching to 200% elongation and back, a repeatable resistance decrease of greater than 0% to about 20% over a range of elongation from greater than 0% to about 100% was observed.

Example 23 Use of Cross-linked Liquid Metal Particle Networks as a Passive Strain Monitor with Active Sensing. Cross-linked particle networks prepared according to Example 17 are drop cast onto an elastomer substrate comprising 2-hydroxyethyl acrylate and the system is heated until dry. The system is optionally encapsulated and then the 2-hydroxyethyl acrylate substrate is adhered to an element of interest capable of undergoing strain and being of higher modulus than the substrate. The cross-linked particle network is electrically connected in line with a circuit that is also connected to a power source and an element capable of indicating, such as a light or communication module. When the element of interest undergoes sufficient strain the cross-linked particle network will greatly increase in conductivity and complete the circuit.

Example 24 Use of Cross-linked Liquid Metal Particle Networks as a Passive Strain Monitor. Cross-linked particle networks prepared according to Example 17 are drop cast onto an elastomer substrate comprising 2-hydroxyethyl acrylate in a radio-frequency identification (RFID) antenna pattern and the system is heated until dry. The system is optionally encapsulated and then the 2-hydroxyethyl acrylate substrate is adhered to an element of interest capable of undergoing strain and being of higher modulus than the substrate. When the element of interest undergoes sufficient strain the cross-linked particle network will greatly increase in conductivity and be readable by an RFID reader.

Example 25 Use of Cross-linkable Liquid Metal Encapsulates for Ink-Jet and/or Aerosol Jet Printing and Subsequent Network Formation. Liquid metal encapsulates are prepared according to Example 7 and diluted with n-methyl-2-pyrrolidone such that the encapsulates are suspended in a solution of 75% by volume ethanol and 25% by volume n-methyl-2-pyrrolidone. To this solution is added 4% by weight of a solution of triarylsulfonium hexafluoroantimonate in propylene carbonate (50/50 by weight). This solution is then ink-jet printed or aerosol jet printed with a thickness between 1-100 microns and exposed to 94.125 milliwatts per square centimeter of 365 nanometer wavelength light for 180 seconds to cross-link particles together.

Example 26 Production of Patterned and Substrate Bound Cross-linked Liquid Metal Particle Networks based on 11-Phosphonoundecyl Acrylate Functionalized EGaIn Liquid Metal Encapsulates. 3 millgrams of photoinitiator phenylbis(2,4,6-trimethylbenzoyl)phosphine oxide was added to a 4 milliliter solution of ethanol and 200 milligrams of eutectic GaIn particles functionalized with 11-phosphonoundecyl acrylate according to Example 1. This solution was drop cast onto an elastomer substrate comprising 2-hydroxyethyl acrylate. When the agglomerate appeared visually dry, 365 nanometer wavelength light was irradiated in a pattern from underneath the substrate for 180 seconds at an intensity of 94.125 milliwatts per square centimeter to selectively cross-link the particles into a network which also has linkages to the elastomer substrate.

Example 27 Use of Activated Particle Networks as a Stretchable Inductor that can be physically tuned. Activated particle networks prepared according to Example 22 are fashioned into a coil. A changing magnetic field is applied to the activated particle networks in either a stretched or non-stretched state to induce a current via inductance. As the particle network is elongated and physically modified the inductance and/or inductive coupling to a nearby circuit is also modulated.

Example 28 Use of Activated Particle Networks as a Stretchable Capacitor that can be physically tuned. Activated particle networks prepared according to Example 22 are fashioned into parallel elements such that the separation between the elements relative to the surface area of the elements closest shared face is small. A DC voltage is applied to the activated particle networks in either a stretched or non-stretched state to induce capacitance. As the particle network is elongated and physically modified the inductance and/or inductive coupling to a nearby circuit is also modulated.

Example 29 Use of Activated Particle Networks as a Low Variation Stretchable Electrical Interconnect. Activated particle networks prepared according to Example 22 are combined in line with an electrical device such that the activated particle network may stretch during operation while allowing uninhibited continuous function of the electrical device between strains of 1-100%.

Example 30 Use of Activated Particle Networks as a Stretchable Conductor for Consistent Power Delivery. Activated particle networks prepared according to Example 22 are connected with both a power source and an electrical device such that the activated particle network may stretch during operation. Transmission of DC current from the power source to the electrical device is stable as the activated particle network is stretched between 1-100% elongation.

Example 31 Use of Cross-linked Particle Networks as a Push-to-Connect Stretchable Interconnect. Cross-linked particle networks prepared according to Example 17 are drop cast between two or more electrical elements such that the cross-linked particle networks make physical contact with the electrical elements and span the distance between them. Compressive force is applied through a low-surface energy material onto the cross-linked particle networks such that the particles of the network rupture to form an electrically conductive wire spanning the electrical elements.

Example 32 Use of Cross-linked Particle Networks as a Damage Healing Element for Conductors. Cross-linked particle networks prepared according to Example 17 are drop cast onto a conductive element. A damaging force which compromises the electrical integrity of the underlying conductive element is applied such that the cross-linked particle networks rupture. After removal of the damaging force the ruptured particles connect undamaged areas of the conductive element to restore conductivity across the conductive element.

Example 33 Production of a substrate with a pre-formed liquid metal encapsulate network. A core shell liquid metal encapsulate network precursor prepared according to Example 1 was combined with 4 mg of azobisisobutyronitrile and deposited onto adhesive tape with normal tensile adhesion of about 690 kPa (as determined by ASTM D-897 to aluminum, 1 int, room temperature) and strain at break of about 800% (available from 3M) in a straight line 10 millimeters long using an extrusion pump. This combination was then heated to 80° C. for 1 hour, after which time it was allowed to cool to room temperature. This combination was then stretched to 300% strain and allowed to relax back to a zero strain state to activate the liquid metal encapsulate network. A second piece of the adhesive tape was then placed over the core shell liquid metal encapsulate network. Copper electrodes were inserted through the first layer of adhesive tape on each end of the core shell liquid metal encapsulate network trace.

Example 34 Production of a substrate without a pre-formed liquid metal encapsulate network. A core shell liquid metal encapsulate network precursor prepared according to Example 1 was combined with 4 mg of azobisisobutyronitrile and deposited onto adhesive tape with normal tensile adhesion of about 690 kPa (as determined by ASTM D-897 to aluminum, 1 int, room temperature) and strain at break of about 800% (available from 3M) in a straight line 10 millimeters long using an extrusion pump. This combination was then heated to 80° C. for 1 hour, after which time it was allowed to cool to room temperature. A second piece of the adhesive tape was then placed over the core shell liquid metal encapsulate network. This combination was then stretched to 300% strain and allowed to relax back to a zero strain state, activating the liquid metal encapsulate network. Copper electrodes were inserted through the first layer of adhesive tape on each end of the core shell liquid metal encapsulate network trace.

Example 35 Production and use of a heated therapeutic brace for a knee or elbow joint. A substrate prepared according to Example 33 is integrated into a knee brace or elbow brace by attaching the adhesive tape directly to an existing brace on the external or internal surface of the brace and the substrate electrodes are attached to a battery to supply a voltage of between 2-20 volts to the substrate to thermally heat the substrate, and therefore the joint, while allowing repeated joint articulation.

Example 36 Production and use of a heated blanket that undergoes resistive heating. One or more substrates prepared according to Example 33 are integrated into a blanket by attaching the adhesive tape directly to an existing blanket and the substrate electrodes are attached to one or more power supplies to supply a voltage of between 2-20 volts to each substrate to thermally heat the substrate, and therefore the blanket.

Example 37 Production and use of a heated textile powered by free space radio frequency absorption. An inductive coil comprised of a substrate prepared according to Example 33 is integrated into a textile material such that the substrate absorbs free space radio frequency electromagnetic radiation. The inductive coil substrate provides electrical current via direct wire connections to an additional substrate prepared according to Example 33, which thermally heats the textile materials.

Example 38 Production and use of a thermally-responsive laminate structure. A substrate prepared according to Example 33 is integrated into a laminate structure of one or more layers. One or more layers comprising an actuator or phase change material that changes its mechanical, chemical, or optical properties as the substrate heats the laminate structure.

Example 39 Production and use of a chair with consistent heating. A substrate prepared according to Example 33 is incorporated into a chair such that when a user applies compressive loading directly to the integrated substrate, a battery directly wired to the substrate, provides between 2-20 volts, causing the substrate to consistently heat.

Example 40 Production and use of a photonically or thermally responsive structure. A substrate prepared according to Example 33 is added to a thermally and/or photonically responsive liquid crystal elastomer structure. The input of a thermal or photonic stimulus then initiates a physical shape change in response. The thermal stimulus can be delivered via resistive heating.

Example 41 Production and use of a stretchable infrared signaling device. A substrate prepared according to Example 34 except that it is not strained by 300% to activate the liquid metal encapsulate network, is attached to a voltage source such that it conducts current and resistively heats when the substrate is mechanically strained to a degree sufficient to produce the conductive network. The heating of the substrate produces a distinctive infrared signature which can be read by an infrared detector.

Example 42 Production and use of a jacket with consistent heating. A substrate prepared according to Example 33 is integrated into a textile that can then be used to manufacture a jacket with an attached battery that supplies current to the substrate to consistently heat the user.

Example 43 Production and use of a tire with tunable mechanical properties. A substrate prepared according to Example 33 is integrated into the rubber tread and sidewall of a tire, where upon passing current through the substrate and resistively heating the rubber, the mechanical properties of the tire change as the local temperature increases above the glass transition temperature of the rubber compound.

Example 44 Production and use of a glove with haptic feedback. A substrate according to Example 33 is integrated into a glove capable of altering texture in response to a stimulus. This glove could be used to provide responsive feedback in a virtual reality system. The substrate could be used for strainable power delivery, connecting to the responsive functionality capable of changing texture.

Example 45 Production and use of a stretchable inductive power receiver. A substrate is prepared according to Example 33 with a frequency-specific geometry to match the inductive output of a separate inductive coil. The separate inductive coil provides wireless power transfer to an article as a portion of the circuit.

Example 46 Production and Use of an Article Comprising EGaIn Particles and an Adhesive Substrate. Gallium and indium were combined to produce a eutectic liquid alloy of 14.2 atom % In and 85.8 atom % Ga (EGaIn). 2 g of the GaIn alloy and 10 mL of ethanol (200 proof, anhydrous USP) were added to a 50 mL polypropylene conical tube. The mixture was probe-sonicated with an ultrasonic processor (VibraSonics VCX500) at 20 kHz with 80 um amplitude using a ⅛" diameter tapered microtip for 2 min. The resulting particles had diameters ranging from 23 nanometers to 6.4 microns, with a geometric mean particle diameter of 860 nanometers. The resulting colloidal solution was vortex mixed and drop-cast onto an adhesive tape with normal tensile adhesion of about 690 kPa (as determined by ASTM D-897 to aluminum, 1 in$^2$, room temperature) and strain at break of about 800% (available from 3M). The mean contact area between the particle population and the substrate was 4045.6 nanometers squared, and the mean particle attachment strength was 2.79 micronewtons. Following evaporation of the ethanol, the tape was stretched to 200% strain to rupture the particles and produce a conductive trace.

Example 47 Production and Use of an Article Comprising Larger EGaIn Particles and an Adhesive Substrate. Gallium and indium were combined to produce a eutectic liquid alloy of 14.2 atom % In and 85.8 atom % Ga (EGaIn). 2 g of the GaIn alloy and 10 mL of ethanol (200 proof, anhydrous USP) were added to a 50 mL polypropylene conical tube. The mixture was probe-sonicated with an ultrasonic processor (VibraSonics VCX500) at 20 kHz with 80 um amplitude using a ⅛" diameter tapered microtip for 1 min. The resulting particles had diameters ranging from 50 nanometers to 12 microns, with a geometric mean particle diameter of 1.1 microns. The resulting colloidal solution was vortex mixed and drop-cast onto an adhesive tape with normal tensile adhesion of about 690 kPa (as determined by ASTM D-897 to aluminum, 1 in$^2$, room temperature) and strain at break of about 800% (available from 3M). The mean contact area between the particle population and the substrate was 5176.6 nanometers squared, and the mean particle attachment strength was 3.57 micronewtons. Following evaporation of the ethanol, the tape was stretched to 100% strain to rupture the particles and produce a conductive trace.

Example 48 Production and Use of an Article Comprising EGaIn Particles Produced via Bath Sonication and an Adhesive Substrate. Gallium and indium are combined to produce a eutectic liquid alloy of 14.2 atom % In and 85.8 atom % Ga (EGaIn). 200 mg of the GaIn alloy and 10 mL of ethanol (200 proof, anhydrous USP) are added to a 20 mL glass vial. The mixture is sonicated in an ultrasonic bath (Branson CPXH 1800) for 2 hrs to produce particles with diameters ranging from 100 nanometers to 20 microns, with an a geometric mean particle diameter of 3 microns. The colloidal solution is allowed to settle and the colloidal solution is drop-cast onto an adhesive tape with normal tensile adhesion of about 690 kPa (as determined by ASTM D-897 to aluminum, 1 in$^2$, room temperature) and strain at break of about 800% (available from 3M). The mean contact area between the particle population and the substrate is 14130.1 nanometers squared, and the mean particle attachment strength is 9.75 micronewtons. Following evaporation of the ethanol, the tape is stretched to 100% strain to rupture the particles and produce a conductive trace.

Example 49 Production and Use of an Article Comprising EGaIn Particles Functionalized with 11-Phosphonoundecyl Acrylate and an Adhesive Substrate.

An article was prepared according to Examples 47 or 48 except prior to deposition, the colloidal solution and 20 mg of the ligand 11-phosphonoundecyl acrylate were added to a 20 mL polyethylene vial with a magnetic stir bar. This mixture was heated to 45° C. and stirred for 2 hours to functionalize the liquid metal particles with the ligand. The final colloidal solution was vortex mixed and drop-cast onto an adhesive tape with normal tensile adhesion of about 690 kPa (as determined by ASTM D-897 to aluminum, 1 in$^2$, room temperature) and strain at break of about 800% (available from 3M). Following evaporation of the ethanol, the tape was stretched to 200% strain to rupture the particles and produce a conductive trace.

Example 50 Production and Use of an Article Comprising EGaIn Particles Functionalized with n-Dodecyl Phosphonic Acid and an Adhesive Substrate An article was prepared according to Example 49 except the ligand 11-phosphonoundecyl acrylate was replaced with the ligand n-dodecyl phosphonic acid.

Example 51 Use of an Article Comprising EGaIn Particles and an Adhesive Substrate as a Passive Strain Monitor with Active Sensing. An article is prepared according to Examples 46 through 50 except the tape is not stretched to rupture the EGaIn particles. The system is optionally encapsulated and the article is adhered to an element of interest capable of undergoing strain and being of higher modulus than the substrate. The article is electrically connected in line with a circuit that is also connected to a power source and an element capable of indicating, such as a light or communication module. When the element of interest undergoes sufficient strain the article will greatly increase in conductivity and complete the circuit to power the indicating element.

Example 52 Use of an Article Comprising EGaIn Particles and an Adhesive Substrate as a Passive Strain Monitor. An article is prepared according to Examples 46 through 50 except the EGaIn particles are deposited in a patterned manner and the tape is not stretched to rupture the EGaIn particles. The system is optionally encapsulated and the article is adhered to an element of interest capable of undergoing strain and being of higher modulus than the substrate. When the element of interest undergoes sufficient strain the article will greatly increase in conductivity and will give off a particular RF signature readable by an RFID reader depending on the pattern of deposition.

Example 53 Use of an Architected Liquid Metal Network as a Radio Frequency Conductor. An article/trace prepared according to Examples 46-50 is fashioned into an antenna and connected with a source capable of generating radio frequency waves.

Example 54 Use of an Architected Liquid Metal Network as a Stretchable Inductor. An article/trace prepared according to Examples 46-50 is fashioned into a coil and a changing magnetic field is applied to the article/trace in either a stretched or non-stretched state to induce a current via inductance.

Example 55 Use of an Architected Liquid Metal Network as a Stretchable Capacitor. An article/trace prepared according to Examples 46-50 is fashioned into parallel elements such that the separation between the elements relative to the surface area of the elements closest shared face is small. A DC voltage is applied to the article/trace in either a stretched or non-stretched state to induce capacitance.

Example 56 Use of an Architected Liquid Metal Network as a Low Variation Stretchable Electrical Interconnect. An article/trace prepared according to Examples 46-50 is combined in line with an electrical device such that the article/trace may stretch during operation while allowing uninhibited continuous function of the electrical device between strains of 1-100%.

Example 57 Use of an Architected Liquid Metal Network for Consistent Power Delivery. An article/trace prepared according to Examples 46-50 is connected with both a power source and an electrical device such that the article/trace may stretch during operation. Transmission of DC current from the power source to the electrical device is stable as the activated particle network is stretched between 1-300% elongation.

Example 58 Production and Use of an Article Comprising Larger EGaIn Particles and an Adhesive Substrate. Gallium and indium are combined to produce a eutectic liquid alloy of 14.2 atom % In and 85.8 atom % Ga (EGaIn). 2 g of the GaIn alloy and 10 mL of ethanol (200 proof, anhydrous USP) are added to a 50 mL polypropylene conical tube. The mixture is shear-mixed with vigorous shaking. The resulting particles have a geometric mean particle diameter of 5 millimeters. The resulting colloidal solution is allowed to settle and drop-cast onto an adhesive tape with normal tensile adhesion of about 690 kPa (as determined by ASTM D-897 to aluminum, 1 int, room temperature) and strain at break of about 800% (available from 3M). The mean contact area between the particle population and the substrate is 23.5 micrometers squared, and the mean particle attachment strength is 0.016 newtons. Following evaporation of the ethanol, the tape is stretched to 50% strain to rupture the particles and produce a conductive trace.

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A process of producing a substrate comprising incorporating a core shell liquid metal encapsulate network comprising a plurality of core shell liquid metal encapsulates comprising multi-functional ligands, said process comprising stimulating said multi-functional ligands by imparting energy to said ligands and/or combining said multi-functional ligands with one or more initiators.

2. A process according to claim 1 wherein said core shell liquid metal encapsulates comprising multi-functional ligands are suspended in a continuous liquid phase prior to being stimulated and optionally deposited on a substrate and optionally dried on said substrate.

3. A method of heating an article comprising a substrate comprising a first material selected from the group consisting of films comprising celluloses, animal leathers, natural polyisoprenes, natural latex rubbers, modified starches, skin, polyvinyl chlorides, polyethyleneterepthalate, polypropylenes, hydroxyethylacrylate, acrylics, modacrylics, polylactic acids, polybutadienes, nylons, aramids, polyesters, polyvinyl alcohols, polyurethanes, polyureas, polystyrenes, polyhydroxybutyrates, polyglycolides, polydimethylsiloxanes, polycaprolactones, styrene-butadiene rubbers, polybutylenes, polyisoprenes, polychloroprenes, polybutenes, polyhydroxyalkanoates, poly(3-hydroxybutyrate-co-3-hydroxyvalerate), poly(vinylidene fluoride) and copolymers, tetrafluoroethylene copolymers, perfluoromethylvinyl ether copolymers, tetrafluoroethylene propylene, polyolefins, polybutylene succinates, polybutylene adipate terephthalates, and mixtures thereof; and/or a material selected from the group consisting of fibers comprising cellulosic polymers, lignin-based polymers, proteinaceous polymers, minerals, vinyls, polyacrylonitriles, modacrylics, polystyrenes, polylactides, polybutadienes, polyesters, polyamides, polyethylenes, polybenzoxazoles, polyurethanes, polyureas, polyhydroxybutyrates, polyglycolides, polycaprolactones, polydimethylsiloxanes, polytetrafluoroethylenes, fluorinates ethylene propylenes, ethylene tetrafluoroethylenes, polyolefins, polyhydroxyalkanoates, polybutylene succinates, polybutylene adipate terephthalates, carbon fibers, and mixtures thereof; and a core shell liquid metal encapsulate network comprising a plurality of encapsulates comprising a liquid metal core having an external surface, a metal oxide shell that encapsulates said liquid metal core, said shell having an external shell surface; and one or more multi-functional ligands covalently bound to said shell's external surface and/or coordinatively bound to said liquid metal core's external surface:
 a) said liquid metal core comprising a liquid metal selected from the group consisting of Hg, Pb, Sn, Sb, Cd, Bi, Ga, In, Al, Zn, Ag, Au, Tl and mixtures thereof;
 b) said shell comprising a metal oxide comprising a cation derived from a metal selected from the group consisting of Ga, In, Sn, Pb, Sb, Cd, Al, Zn, Tl, Bi, Ca, Sc, Ti, V, Cr, Sr, Y, Zr, Nb, Mo, Te, Gd, Hf, Pr, Nd, Pt, Sm, Eu, Dy, Ho, Er, Yb, Pu and mixtures thereof; and
 c) said one or more multi-functional ligands comprising a head group that comprises a material selected from the group consisting of thiols, amines, phosphonic acids, alkoxysilanes, halosilanes, nitriles, and mixtures thereof;
 said encapsulates being covalently bound via a linkage comprising a residue of said ligands of said encapsulates to the external shell of an encapsulate other than the external shell of the encapsulate to which said ligands were originally covalently or coordinatively bound, said method comprising subjecting said article's substrate to alternating current, direct current and/or a time varying electromagnetic field with the proviso that said substrate is not simultaneously subjected to direct current and alternating and when said article's substrate is subjected to direct current or alternating current, said substrate comprising an electrical connection that is connected to an alternating current or direct current power source, said article being a garment, a furniture item, bedding, a vehicle, sporting good, electronic device, safety equipment, medical device, and/or appliance.

4. A method of providing an electric power transmission capability to an article, said method comprising incorporating a substrate comprising a first material selected from the group consisting of films comprising celluloses, animal leathers, natural polyisoprenes, natural latex rubbers, modified starches, skin, polyvinyl chlorides, polyethyleneterepthalate, polypropylenes, hydroxyethylacrylate, acrylics, modacrylics, polylactic acids, polybutadienes, nylons, aramids, polyesters, polyvinyl alcohols, polyurethanes, polyureas, polystyrenes, polyhydroxybutyrates, polyglycolides, polydimethylsiloxanes, polycaprolactones, styrene-butadiene rubbers, polybutylenes, polyisoprenes, polychloroprenes, polybutenes, polyhydroxyalkanoates, poly(3-hydroxybutyrate-co-3-hydroxyvalerate), poly(vinylidene fluoride) and copolymers, tetrafluoroethylene copolymers, perfluoromethylvinyl ether copolymers, tetrafluoroethylene propylene, polyolefins, polybutylene succinates, polybutylene adipate terephthalates, and mixtures thereof; and/or a material selected from the group consisting of fibers comprising cellulosic polymers, lignin-based polymers, proteinaceous polymers, minerals, vinyls, polyacrylonitriles, modacrylics, polystyrenes, polylactides, polybutadienes, polyesters, polyamides, polyethylenes, polybenzoxazoles, polyurethanes, polyureas, polyhydroxybutyrates, polyglycolides, polycaprolactones, polydimethylsiloxanes, polytetrafluoroethylenes, fluorinates ethylene propylenes, ethylene tetrafluoroethylenes, polyolefins, polyhydroxyalkanoates, polybutylene succinates, polybutylene adipate terephthalates, carbon fibers, and mixtures thereof; and a core shell liquid metal encapsulate network comprising a plurality of encapsulates comprising a liquid metal core having an external surface, a metal oxide shell that encapsulates said liquid metal core, said shell having an external shell surface; and one or more multi- functional ligands covalently bound to said shell's external surface and/or coordinatively bound to said liquid metal core's external surface:
 a) said liquid metal core comprising a liquid metal selected from the group consisting of Hg, Pb, Sn, Sb, Cd, Bi, Ga, In, Al, Zn, Ag, Au, Tl and mixtures thereof;
 b) said shell comprising a metal oxide comprising a cation derived from a metal selected from the group consisting of Ga, In, Sn, Pb, Sb, Cd, Al, Zn, Tl, Bi, Ca, Sc, Ti, V, Cr, Sr, Y, Zr, Nb, Mo, Te, Gd, Hf, Pr, Nd, Pt, Sm, Eu, Dy, Ho, Er, Yb, Pu and mixtures thereof; and
 c) said one or more multi-functional ligands comprising a head group that comprises a material selected from the group consisting of thiols, amines, phosphonic acids, alkoxysilanes, halosilanes, nitriles, and mixtures thereof;
 said encapsulates being covalently bound via a linkage comprising a residue of said ligands of said encapsulates to the external shell of an encapsulate other than the external shell of the encapsulate to which said ligands were originally covalently or coordinatively bound, into and/or on said article and stretching said article.

5. A method of measuring maximum experienced strain, said method comprising determining a change in resistance, capacitance and/or inductance of a substrate having resistance, capacitance and/or inductance, said substrate comprising a first material selected from the group consisting of films comprising celluloses, animal leathers, natural polyisoprenes, natural latex rubbers, modified starches, skin, polyvinyl chlorides, polyethyleneterepthalate, polypropylenes, hydroxyethylacrylate, acrylics, modacrylics, polylactic acids, polybutadienes, nylons, aramids, polyesters, polyvinyl alcohols, polyurethanes, polyureas, polystyrenes, polyhydroxybutyrates, polyglycolides, polydimethylsiloxanes, polycaprolactones, styrene-butadiene rubbers, polybutylenes, polyisoprenes, polychloroprenes, polybutenes, polyhydroxyalkanoates, poly(3-hydroxybutyrate-co-3-hydroxyvalerate), poly(vinylidene fluoride) and copolymers, tetrafluoroethylene copolymers, perfluoromethylvinyl ether copolymers, tetrafluoroethylene propylene, polyolefins, polybutylene succinates, polybutylene adipate terephthalates, and mixtures thereof; and/or a material selected from the group consisting of fibers comprising cellulosic polymers, lignin-based polymers, proteinaceous polymers, minerals, vinyls, polyacrylonitriles, modacrylics, polystyrenes, polylactides, polybutadienes, polyesters, polyamides, polyethylenes, polybenzoxazoles, polyurethanes, polyureas, polyhydroxybutyrates, polyglycolides, polycaprolactones, polydimethylsiloxanes, polytetrafluoroethylenes, fluorinates ethylene propylenes, ethylene tetrafluoroethylenes, polyolefins, polyhydroxyalkanoates, polybutylene succinates, polybutylene adipate terephthalates, carbon fibers, and mixtures thereof; and a core shell liquid metal encapsulate network comprising a plurality of encapsulates comprising a liquid metal core having an external surface, a metal oxide shell that encapsulates said liquid metal core, said shell having an external shell surface; and one or more multi-functional ligands covalently bound to said shell's external surface and/or coordinatively bound to said liquid metal core's external surface:
  a) said liquid metal core comprising a liquid metal selected from the group consisting of Hg, Pb, Sn, Sb, Cd, Bi, Ga, In, Al, Zn, Ag, Au, Tl and mixtures thereof;
  b) said shell comprising a metal oxide comprising a cation derived from a metal selected from the group consisting of Ga, In, Sn, Pb, Sb, Cd, Al, Zn, Tl, Bi, Ca, Sc, Ti, V, Cr, Sr, Y, Zr, Nb, Mo, Te, Gd, Hf, Pr, Nd, Pt, Sm, Eu, Dy, Ho, Er, Yb, Pu and mixtures thereof; and
  c) said one or more multi-functional ligands comprising a head group that comprises a material selected from the group consisting of thiols, amines, phosphonic acids, alkoxysilanes, halosilanes, nitriles, and mixtures thereof;
  said encapsulates being covalently bound via a linkage comprising a residue of said ligands of said encapsulates to the external shell of an encapsulate other than the external shell of the encapsulate to which said ligands were originally covalently or coordinatively bound, and comparing said change in resistance, capacitance and/or inductance to a calibration curve of maximum strain versus resistance, capacitance and/or inductance.

6. A method of changing an article, said article having a shape and comprising a substrate comprising a first material selected from the group consisting of films comprising celluloses, animal leathers, natural polyisoprenes, natural latex rubbers, modified starches, skin, polyvinyl chlorides, polyethyleneterepthalate, polypropylenes, hydroxyethylacrylate, acrylics, modacrylics, polylactic acids, polybutadienes, nylons, aramids, polyesters, polyvinyl alcohols, polyurethanes, polyureas, polystyrenes, polyhydroxybutyrates, polyglycolides, polydimethylsiloxanes, polycaprolactones, styrene-butadiene rubbers, polybutylenes, polyisoprenes, polychloroprenes, polybutenes, polyhydroxyalkanoates, poly(3-hydroxybutyrate-co-3-hydroxyvalerate), poly(vinylidene fluoride) and copolymers, tetrafluoroethylene copolymers, perfluoromethylvinyl ether copolymers, tetrafluoroethylene propylene, polyolefins, polybutylene succinates, polybutylene adipate terephthalates, and mixtures thereof; and/or a material selected from the group consisting of fibers comprising cellulosic polymers, lignin-based polymers, proteinaceous polymers, minerals, vinyls, polyacrylonitriles, modacrylics, polystyrenes, polylactides, polybutadienes, polyesters, polyamides, polyethylenes, polybenzoxazoles, polyurethanes, polyureas, polyhydroxybutyrates, polyglycolides, polycaprolactones, polydimethylsiloxanes, polytetrafluoroethylenes, fluorinates ethylene propylenes, ethylene tetrafluoroethylenes, polyolefins, polyhydroxyalkanoates, polybutylene succinates, polybutylene adipate terephthalates, carbon fibers, and mixtures thereof; and a core shell liquid metal encapsulate network comprising a plurality of encapsulates comprising a liquid metal core having an external surface, a metal oxide shell that encapsulates said liquid metal core, said shell having an external shell surface; and one or more multi-functional ligands covalently bound to said shell's external surface and/or coordinatively bound to said liquid metal core's external surface:
  a) said liquid metal core comprising a liquid metal selected from the group consisting of Hg, Pb, Sn, Sb, Cd, Bi, Ga, In, Al, Zn, Ag, Au, Tl and mixtures thereof;
  b) said shell comprising a metal oxide comprising a cation derived from a metal selected from the group consisting of Ga, In, Sn, Pb, Sb, Cd, Al, Zn, Tl, Bi, Ca, Sc, Ti, V, Cr, Sr, Y, Zr, Nb, Mo, Te, Gd, Hf, Pr, Nd, Pt, Sm, Eu, Dy, Ho, Er, Yb, Pu and mixtures thereof; and
  c) said one or more multi-functional ligands comprising a head group that comprises a material selected from the group consisting of thiols, amines, phosphonic acids, alkoxysilanes, halosilanes, nitriles, and mixtures thereof;
  said encapsulates being covalently bound via a linkage comprising a residue of said ligands of said encapsulates to the external shell of an encapsulate other than the external shell of the encapsulate to which said ligands were originally covalently or coordinatively bound, said method comprising manipulating said article's shape when said substrate's liquid metal is above said liquid metal's solidus and passively and/or actively cooling said substrate to a temperature below said liquid metal's solidus, optionally repeating said method one or more times thereby changing said article's shape.

* * * * *